United States Patent [19]

Waldhauer

[11] Patent Number: 4,882,761

[45] Date of Patent: Nov. 21, 1989

[54] LOW VOLTAGE PROGRAMMABLE COMPRESSOR

[75] Inventor: Fred D. Waldhauer, La Honda, Calif.

[73] Assignee: Resound Corporation, Redwood City, Calif.

[21] Appl. No.: 159,949

[22] Filed: Feb. 23, 1988

[51] Int. Cl.$^4$ .......................... H04R 29/00; H04R 1/64
[52] U.S. Cl. .......................................... 381/106; 455/72
[58] Field of Search ................... 381/104, 106, 94, 98, 381/29, 23.1; 455/72

[56] References Cited

U.S. PATENT DOCUMENTS

| | | | |
|---|---|---|---|
| 3,784,750 | 1/1974 | Stearns | 381/106 |
| 4,068,092 | 1/1978 | Ikoma | 381/104 |
| 4,253,072 | 2/1981 | Fisher | 381/94 |
| 4,696,044 | 9/1987 | Waller | 381/106 |

FOREIGN PATENT DOCUMENTS 2111356  6/1983  United Kingdom ................ 381/106

OTHER PUBLICATIONS

Signal Processing to Improve Speech Intelligibilty in Perceptive Deafness, by Edgar Villchur, *The Journal of the Acoustical Society of America*, pp. 1646–1657, vol. 53, No. 6, 1973.

Widlar, R. T., "A New Breed of Linear IC's Runs at 1 Volt Levels", *Electronics*, Mar. 29, 1979, p. 115.

*Primary Examiner*—Tommy P. Chin

[57] ABSTRACT

A programmable low voltage compressor circuit suitable for use with hearing aids is described. The compressor has a continuously variable compression ratio wherein the gain of the compressor may be programmably controlled over a wide range and the compressor may be powered from a power source as low as 1.1 volt. The compressor employs a variolosser wherein the gain is controlled by the ratio of the currents flowing out of first and second control terminals. A control circuit coupled to the variolosser controls the magnitude of the currents flowing out of the two control terminals. The control circuit includes a peak detector which generates a signal related to the peak positive envelope of the signal input to the compressor. A voltage to current converter is coupled to the peak detector for increasing the magnitude of the current flowing out of one of the control terminals of the variolosser as the voltage output of the peak detector increases. Furthermore, the gain and compression ratio of the compressor over a wide range is programmably controllable.

13 Claims, 15 Drawing Sheets

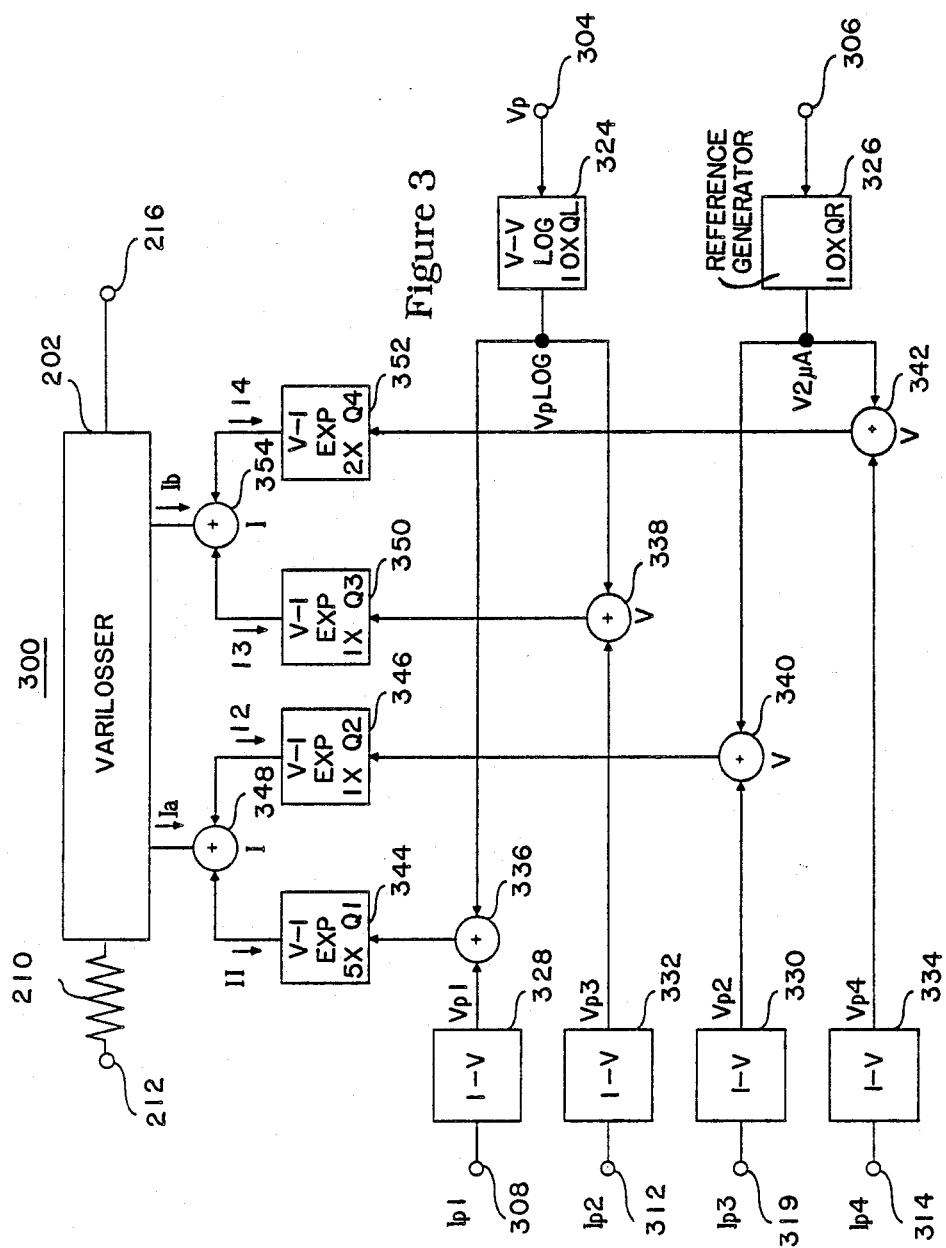

LOW VOLTAGE PROGRAMMABLE COMPRESSOR

FIELD OF THE INVENTION

This invention relates to the field of audio signal processing and specifically to a programmable low voltage compressor circuit suitable for use with hearing aids.

BACKGROUND OF THE INVENTION

Audio compressors and expanders are well known devices which are used to modify the dynamic range of an audio signal. An audio compressor or expander may be considered as having two parts: an electronically controlled variolosser or gain adjusting device and a control system with associated circuits which generate the control signals for controlling the gain of the device as a prescribed function of the input (or output) signal. Control of the dynamic range of an audio signal is important in several applications. Many times the dynamic range of a desired signal may exceed the processing capabilities of available audio circuitry. In many telephone systems, the audio signals are multiplexed resulting in a poor signal-to-noise ratio. Therefore, it is desirable to compress the dynamic range of the audio signals prior to multiplexing and expanding the audio signals at the receiving end to allow a wider dynamic range signal to be passed through the telephone channel.

Another application for audio compressors are devices for the hearing impaired. In many cases, the response of the ear of a hearing impaired person will be substantially different, in terms of sensitivity and frequency response, than that of a normal person. Studies have shown that hearing aids with audio compression provide improved syllabic comprehension for persons with sensori-neural hearing losses. The use of audio compressors for the hearing impaired is described extensively in a report written by Walker and Dillon, entitled "Compression In Hearing Aids: An Analysis, A Review And Some Recommendations," NAL Report No. 90, published by the Australian Commonwealth Department of Health, National Acoustics Laboratories, June 1982.

Audio compressors may also be advantageously employed to tailor the characteristics of a hearing aid device to compensate for the deficiencies of individual users or to simulate normal hearing under a variety of situations such as very quiet or very noisy environments. For example, in many cases, a hearing impaired person will only experience a hearing loss at high frequencies. Therefore, it may be desirable to alter the gain of the compressor as a function of the frequency of the audio signal. In extremely noisy environments, it may e desirable to lower the gain of the hearing aid device and, in quiet environments, it may be desirable to increase the gain of the device. Audio compressors are readily adapted for both of these functions. These concepts may be further understood by referring to Villchur, E., "Signal processing to improve speech intelligibility in perceptive deafness," *Journal of Acoustical Society of America*, Vol. 53, pp. 1646-1657.

Audio compressors are characterized in two categories. If the control signals are derived from the input signal of the compressor, the compressor is said to be of the feedforward type; if the control signals are derived from the output of the compressor, the compressor is said to be of the feedback type. The feedforward configuration requires that the dynamic range of the associated gain control circuitry be equal to that of the input signal. The advantage of this configuration is that the circuit is inherently stable. In a feedback configuration, a larger range of signals can be accurately processed since the gain control signal samples the output signal which has already been compressed. However, instability is often a problem with feedback compressors.

Many variations in the topology of compressors have appeared in the past. One example of a compressor or expander (compander) employs the Signetics NE570 which is primarily adapted for use with telephone systems. Another example of a prior compressor is disclosed in U.S. Pat. No. 4,112,254, invented by Blackmer and entitled "Signal Compander System".

While the advantages of compression have been recognized, each of the above-mentioned systems have used compressors having a relatively fixed compression ratio or have been limited to uses where a relatively high voltage is available to power the compressor circuitry. The trend in the hearing aid industry today is to design hearing aid devices in increasingly small packages and some models today are tiny enough to be positioned in the ear canal. The advantages of compression have heretofore been unavailable in a canal aid device because these devices are typically operated from a small single cell battery which provides a relatively low power supply voltage, and has limited current supply capability. Prior to the instant invention, a programmable compressor having a continuously variable compression ratio which is capable of operating from a 1.2 battery has proved extremely difficult to manufacture.

SUMMARY OF THE INVENTION

Briefly described, the present invention contemplates a compressor having a continuously variable compression ratio wherein the gain of the compressor may be programmably controlled over a wide range and the compressor may be powered from a power source as low as 1.1.V. The present low voltage compressor comprises a means for inputting an audio signal, and a variolosser having first and second control terminals wherein the gain of the variolosser is controlled by the ratio of the currents flowing out of the first and second control terminals. A control circuit coupled to the variolosser controls the magnitude of the currents flowing out of the first and second control terminals. The control circuit includes a peak detector coupled to the input means for generating a signal related to the peak positive envelope of the input signal. The control circuit further includes a voltage-to-current converter coupled to the peak detector wherein the voltage-to-current converter increases the magnitude of the current flowing out of the first control terminal as the voltage output of said peak detector means increases. The present invention further includes a means of programmably controlling the gain and compression ratio of the compressor over a very wide range. In another aspect of the present invention, an expander may be constructed without additional components by simply reprogramming the compressor.

Accordingly, it is an object of the present invention to provide a programmable audio compressor which is operable from a low voltage battery.

It is another object of the present invention to provide a programmable circuit structure which may be used to expand or compress an audio signal.

It is yet another object of the present invention to provide a programmable compressor with a continuously variable compression ratio which is easily manufactured on an integrated circuit.

It is still another object of the present invention to provide a programmable compressor with a continuously variable compression ratio and variable gain.

It is still another object of the present invention to provide a programmable compressor structure wherein the maximum signal handling capability is provided for the largest input signals.

BRIEF DESCRIPTION OF THE DRAWING

These and other objects may be fully understood through the description below and the accompanying drawing in which:

FIG. 3 is a block diagram used to explain the programmable compression ratio feature of the present invention.

DETAILED DESCRIPTION OF THE INVENTION

Figure 1:
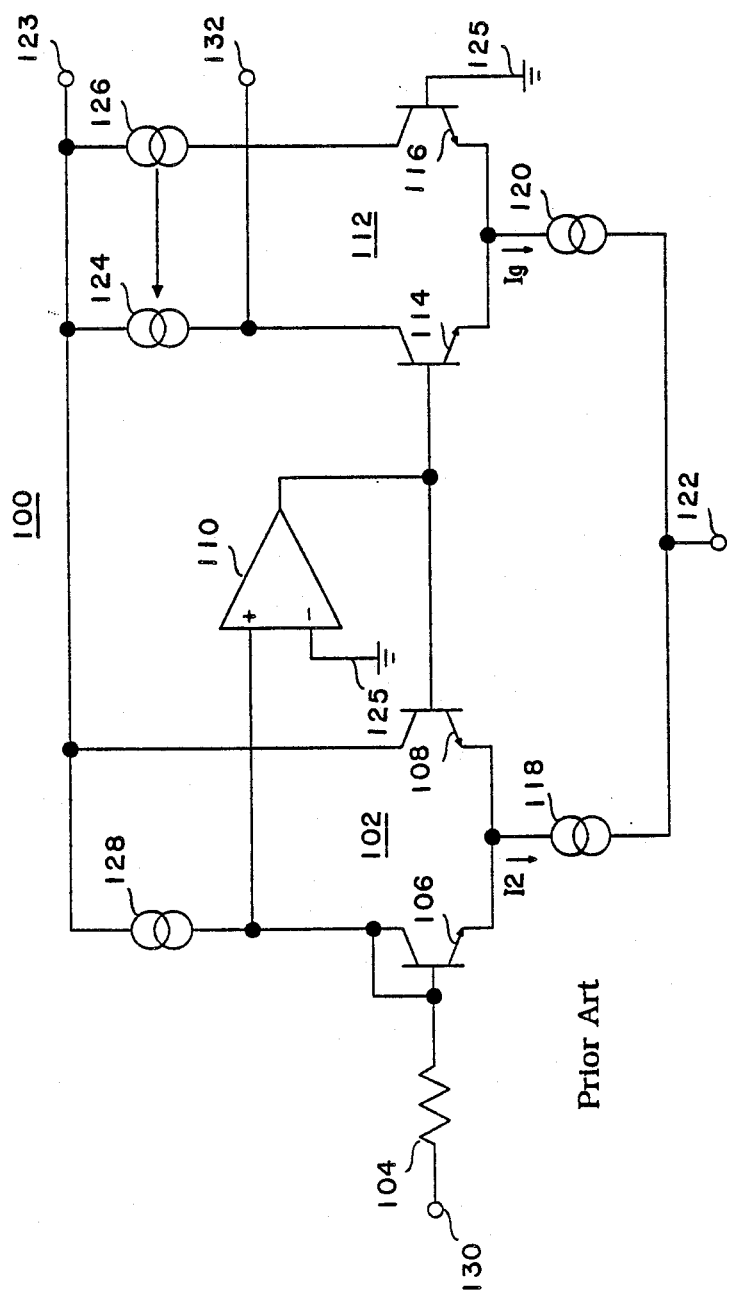
FIG. 1 is a schematic diagram of a prior art variolosser adapted for use with a telephone system.

A compressor or expander comprises a variable gain circuit or variolosser and a control circuit which varies the gain of the variolosser based on a desired relationship between the input and output signals. In the case of the present invention, the variable gain circuit or variolosser is a current multiplier whose transfer function is linear. One example of a prior art variolosser is shown in FIG. 1. This device is the Signetics NE572 referred to above and it is typically employed in feedback type compressors. In the circuit 100, the input signal is coupled to a differential amplifier 102 through resistor 104. The differential amplifier 102 comprises transistors 106 and 108 which are coupled with their emitters in common. The base and collector of transistor 106 are coupled together, thereby forming a diode which rectifies the input signal. This common connection is coupled to the non-inverting input of operational amplifier 110. The inverting input of operational amplifier 110 is coupled to ground terminal 125. The output of circuit 100 comprises differential pair 112 which includes transistors 114 and 116. The base terminals of transistor 108 and transistor 114 are coupled in common. This common connection is coupled to the output of operational amplifier 110. Current sinks 118 and 120 are coupled between the common emitters of differential pairs 102 and 112 and a reference terminal 122. Current sources 124 and 126 are disposed between the power supply input terminal 123 and the collectors of transistors 114 and 116, respectively. Current source 124 is a variable current source whose output is related to the output of current source 126. A current source 128 is coupled between the power supply input terminal 123 and the collector/base connection of transistor 106. With this type of variable gain circuit, a compressor is formed by placing the variolosser 100 in the feedback loop of an operational amplifier and accordingly is prone to instability. Current gain in this device is controlled by varying the output current Ig in differential pair 112 relative to the fixed current I2 in differential pair 102. The circuit relies on the virtual ground between the input of operational amplifier 110 (with negative feedback) to maintain equal base-to-emitter voltages between its two emitter coupled pairs 102 and 112, and the input diode formed by transistor 106.

As an increasing signal appears at the input terminal 130, the current therefrom is summed with the current generated by current source 128 at the input of operational amplifier 110 which generates a decreasing output voltage in response thereto. This decreasing voltage lowers the base voltage of transistor 114. This in turn causes current sources 124 and 126 to generate a relatively lower current at output terminal 132. In a similar fashion, a decreasing input current at terminal 130 will cause current sources 124 and 126 to generate a relatively higher current at output terminal 132. Therefore, the current consumption of circuit 100 varies as a function of input current.

In order to vary the current gain of circuit 100 from 0 dB to 20 dB, a 20 dB change in the gain control signal (Ig) is required. As a result, the power dissipation of the circuit 100 increases as a function of the gain control signal Ig. In addition, this circuit requires a relatively high voltage (e.g., 5 volts) for proper operation.

As will be discussed in more detail below, the present invention provides an improvement over the circuit 100 by varying the ratio of current in the input and output differential cells independently or in opposite directions. When used as a compressor, a 20 dB decrease in current gain is achieved by increasing the quiescent current of the input differential pair such that the current through the input differential pair is 20 dB greater than the current through the output differential pair. The same circuit to be used as an expander by merely increasing the quiescent current in the output differential pair. Thus, the addition of unstable circuitry is avoided resulting in stable and efficient operation. Unlike the circuit 100, the topology of the present invention also allows the compressor to be adjusted with continuously variable compression ratios.

Referring now to FIGS. 2A through 2D, there is shown a series of block diagrams detailing several embodiments of compressors or expanders which may incorporate the variolosser of the present invention. Compressors and expanders may be configured in feedforward or feedback configurations. Compressors and expanders comprise two main components: a variable gain circuit or variolosser and a control circuit which controls the gain of the variable gain circuit based on a desired relationship between the input and output signals. As will be described in more detail below, the operation of the compressor of the present invention is controlled by two current signals, Ia and Ib. Specifically, the gain of the variolosser is set by the ratio Ib/Ia.

Figure 2A:
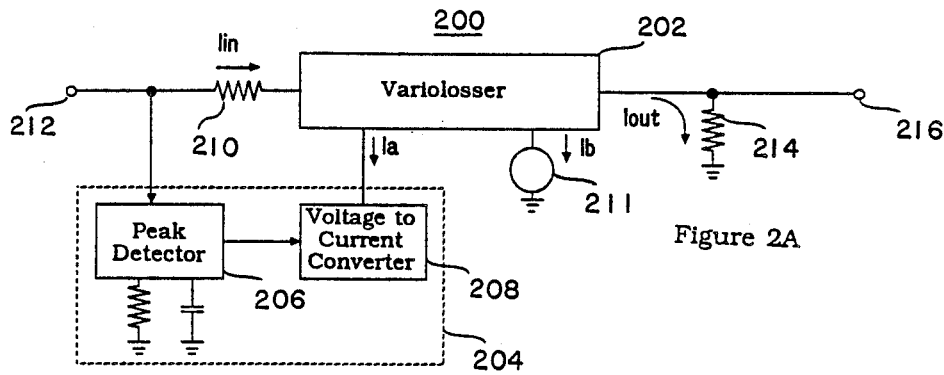
FIGS. 2A-2D are block diagrams of several embodiments of the present invention which provide either compression or expansion functions.

FIG. 2A is a block diagram of a feedforward compressor 200. The compressor 200 includes a variolosser 202 which is coupled to a control circuit 204. The control circuit 204 includes a peak detector 206 and a voltage-to-current converter 208. The control currents Ia and Ib are used to control the relative currents flowing in differential input and output stages of the variolosser. In the preferred practice of the present invention, both of these currents may be controlled during the operation of the compressor. In the circuit 200, the control current Ib is shown as a fixed current. Since the gain of the variolosser is controlled by the ratio of Ia to Ib, the desired result may be obtained by controlling Ia while leaving the level of the control current Ib constant. In the compressor 200, the voltage-to-current converter 208 is used to control the magnitude of current flow of the control current Ia. The voltage used to control the voltage-to-current converter 208 is derived from peak detector 206 which is coupled between input terminal 212 and voltage-to-current converter 208 so that the magnitude of current flow level set by the voltage-to-current converter 208 is related to the peak voltage level of the audio input signal. In the preferred practice of the present invention, the variolosser is a variable gain current amplifier with a linear transfer function. Therefore, a resistor 210 disposed at the input of the variolosser 202 converts the voltage appearing at input terminal 212 to the current signal processed by the variolosser. Similarly, resistor 214 converts the output current signal produced by the variolosser back to a voltage signal which is generated at output terminal 216.

The overall operation of the compressor 200 may be explained as follows:
Assume:
Y = voltage envelope of the output signal appearing at terminal 216;
X = voltage envelope of the input signal appearing at terminal 212; and I b/Ia = gain of variolosser 200
then:

$$Y = (Ib/Ia) X$$

If the peak detector detects the positive envelope of the input signal, the result is a constant times X. If Ia is proportional to this detected voltage:

$$Ia = kX$$

therefore:

$$Y = (Ib/kX)*X = Ib/k$$

Thus, Y is independent of the input signal and the circuit functions as a limiter or a compressor.

Figure 2B:
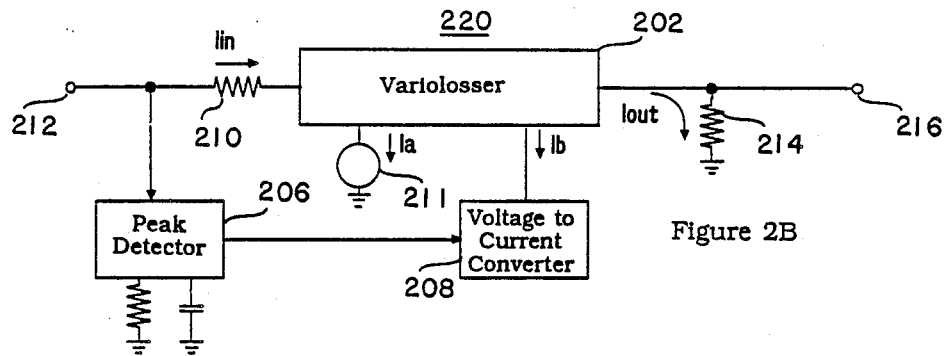

FIG. 2B is a slight modification of the circuit of FIG. 2A wherein the modified circuit 220 functions as an expander. In this embodiment, the control current Ia is maintained at a constant level and the control current Ib is controlled by the voltage to current converter 208. As above, peak detector 206 detects the peak envelope of the input signal and generates a signal which sets the magnitude of current flow level in the voltage-to-current converter 208. In this embodiment, since Ib is proportional to the input voltage, an expander is obtained as defined by the following relationships:
Assume:

$$IB = KX$$

therefore:

$$Y = (IB/IA)*X = (KX2)/Ia$$

Hence, this circuit behavior is an expander with an expansion ratio of 2.

Figure 2C:
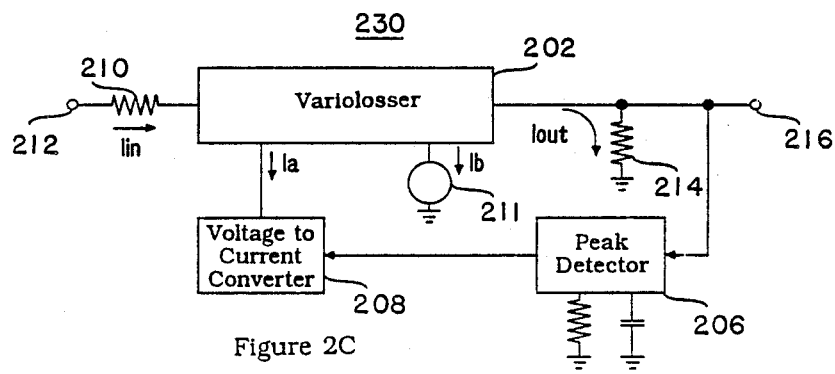

In FIG. 2C, the circuit 230 is configured as a feedback compressor. In this embodiment, the peak detector is coupled to the output of circuit 230 and the voltage-to-current converter 208 is used to control the control current Ia. In this embodiment, since Ia is proportional to the output voltage at terminal 216, a compressor is obtained as defined by the following relationships:

$$Ia = KY$$

$$Y = Ib*(X/kY)$$

therefore:

$$Y = \sqrt{(Ib/k)} * \sqrt{X},$$

a compressor with a compression ratio of 2.

Figure 2D:
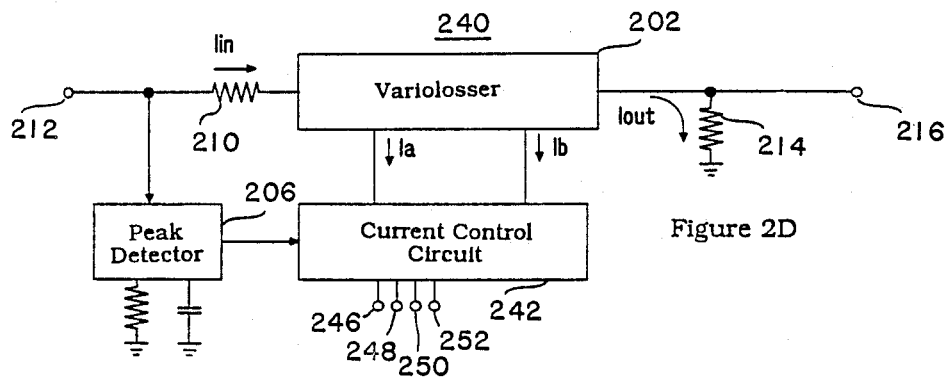

Referring now to FIG. 2D, the preferred practice of the present invention contemplates the use of a control circuit 242 which is adapted to control both control currents IA and IB. The control circuit 242 is responsive to the output of the peak detector 206 and a plurality of programmable control signals coupled to terminals 246–252. A more detailed diagram of the preferred compressor control circuit 242 of the present invention is shown in FIG. 3.

Referring now to FIG. 3, there is shown a block diagram detailing the programmable control feature of the compressor of the present invention. In this aspect of the present invention, a compressor having a programmable continuously variable compression ratio and programmable gain is provided. In the structure 300, a plurality of programming signals and a plurality of control signals control the variolosser 202. As above, the gain of the variolosser 202 is set by the ratio of the control currents Ia and Ib. Since the response of the human ear is substantially logarithmic, it is desirable to adjust the gain of the compressor in logarithmic steps. The compression transfer function is therefore substantially logarithmic. This is accomplished through the use of a log converter which processes certain control signals prior to their application to the variolosser 202. The control signals employed in this aspect of the present invention are the output voltage, Vp, of the peak detector 206, which is coupled to terminal 304, the output voltage, V2µA, of a reference generator 326, which is coupled to input terminal 306, and a plurality of selectable programming signals IP1-IP4 which are coupled to input terminals 308, 312, 310 and 314, respectively. The programming signals coupled to input terminals 308, 312, 310 and 314 are used to set a desired gain and compression ratio for the system 300. The signal, Vp, is a linear signal which is logarithmically converted before application to variolosser 202. Specifically, Vp is coupled to a voltage-to-voltage log converter 324 which converts the linear representation of the peak envelope of the audio input signal to a signal, Vp log, which is logarithmically related thereto.

Each of the programming signals IP1-IP4 is coupled through current-to-voltage converters or resistors 328-334 which convert these signals to linearly related voltage signals. The output of log converter 324 is combined with the outputs of resistor 328 and 332 by voltage summers 336 and 338, respectively. The output of resistor 330 is combined with the output of reference generator 321 by voltage summer 340. The output of resistor 334 is summed with the output of reference generator 326 by voltage summer 342. The outputs of summers 336 and 340 are coupled to exponentiating voltage-to-current converters 344 and 346, respectively, which convert the summed voltage signal produced by summers 336 and 340 to exponential current signals used to control the variolosser 202. Specifically, the outputs of exponential voltage-to-current converters 344 and 346 are combined by current summer 348, and output of current summer 348 is used to control the variolosser control signal Ia. The outputs of summers 338 and 342 are coupled to exponentiating voltage-to-current converters 350 and 352. The outputs of exponential voltage-to-current converters 350 and 352 are combined by current summer 354. The output of current summer 354 is used to control the variolosser control signal Ib.

In operation, the quiescent (minimum) current of the compressor 300 is set by the signal V2µA output by reference generator 326. In the preferred practice of the present invention, a transistor with a predetermined emitter area having its emitter coupled to ground and its base coupled to the signal V2µA will sink approximately 2 µA. Therefore, depending on the required current sinking capacity, the relative sizes of the transistors coupled to V2µA will vary. In addition, the compressor control signals IP1-IP4 are generated in 0.67 µA increments. These control currents may be incremented in a binary sequence to vary the gain of the structure 300 over a range of 32 dB. Summers 336, 338, 340 and 342 combine the various control signals to provide the desired gain and compression ratio. As will be more fully discussed in conjunction with FIGS. 13 and 14, resistors 328, 332, 330 and 334 are approximately 9 KΩ and therefore these 0.67 µA increments correspond to a 2 dB change in the gain of the variolosser. The present invention relies on the logarithmic characteristics of a transistor conducting in its active region to achieve this aspect of the invention. It is known that the collector current of a transistor increases exponentially with linear increases in its base voltage. Therefore, transistors are employed as the exponentiating voltage-to-current converters 344-352 wherein the base voltage of the transistor comprises the input to the converter and the collector current of the transistor comprises the output of the converter. The present invention advantageously employs this characteristic to provide logarithmic increments in gain with linear increments in the programming currents IP1-IP4.

As mentioned above, the control signal V2µA is used to set the quiescent current flowing out of the respective input and output differential cells of variolosser 202. If all other control and programming signals are absent, Ia is set at 0.2 µA by exponentiating voltage-to-current converter 346 and Ib is set at 0.4 µA by exponentiating voltage-to-current converter 352. The current offset in these respective converters are controlled by relative sizes of the transistors which comprise converters 346 and 352. In the preferred practice of the present invention, exponentiating voltage-to-current converters 346 and 350 are transistors which are the same size, each of them being one tenth the size of the output transistors of log converter 324 and reference generator 326. Exponentiating voltage-to-current converter 352 is a transistor which is twice as large as 346 and 350 and exponentiating voltage-to-current converter 344 is a transistor which is 5 times as large as converters 346 and 350. As will be discussed in more detail below, the present invention relies on the size ratio of various transistors to provide the programmable ratio and gain control functions described herein. There are four transistor emitter area ratios which are important in this context. The ratio of the area of the output transistor of V-V log converter 324 and the area of the transistor which comprises exponentiating V-I converter 344, the ratio of the area of the output transistor of V-V log converter 324 and the area of transistor which comprises exponentiating V-I converter 350, the area of the output transistor of reference generator 326 and the area of the transistor which comprises exponentiating voltage-to-current converter 346, and the area of the output transistor of reference generator 326, QR, to the area of the transistor which comprises exponentiating V-I converter 352. If I1-I4 are defined as the collector currents flowing in the transistors which comprise exponentiating V-I converters 344, 346, 350 and 352, respectively, the gain of the variolosser 202 then becomes:

$$\text{Gain} = (I3 + I4)/(I1 + I2) = Ib/Ia$$

with I3 and I1 proportional to the voltage Vp and I2 and I4 proportional to the fixed reference V2µA. The gain of the variolosser may also be expressed in terms of emitter area ratios since the emitter area ratios control the currents I1-I4. Four parameters, K1-K4, related to the emitter areas of the transistors which comprise exponentiating V-I converters 344, 346, 350, and 352 wherein exponentiating V-I converter 344=Q1, exponentiating V-I converter 346=Q2, exponentiating V-I converter 350=Q3 and exponentiating V-I converter 352=Q4 may be defined as follows:

$$K1 = \frac{\text{emitter area } Q1}{\text{emitter area } QL} = I1/IL$$

$$K2 = \frac{\text{emitter area } Q2}{\text{emitter area } QR} = I2/IR$$

$$K3 = \frac{\text{emitter area } Q3}{\text{emitter area } QL} = I3/IL$$

$$K4 = \frac{\text{emitter area } Q4}{\text{emitter area } QR} = I4/IL$$

The variolosser gain may then be defined as:

$$\text{Gain} = (K3i + K4/K1i + K2)$$

therefore, the compressor gain may be controlled by varying either programming currents or emitter area ratios. In the above expression, the variable i represents programming currents employed herein where the programming currents effectively modify the area ratios of the compressor control circuit.

Therefore, if no signal is present at terminal 304, the gain of variolosser 202 remains constant. However, as Vp increases, Ia increases at a faster rate than Ib because of the size differential of converters 344 and 350. Similarly, as the control signals Ip1-Ip4 are incremented, the gain of the variolosser is varied by controlling the desired ratio of currents Ib/Ia. Incrementing the control signals Ip1-Ip4 also controls the compression ratio add of the structure 300 by varying Ia relative to Ib, thus providing a wide range of gain and compression ratios. Assuming that control current I3 is zero, at very small signal levels the gain of the variolosser is substantially controlled by the ratio of I4/I2 because current I1 is negligible. As the input signal rises, I1 increases to the point where it equals I2, so that the gain is substantially I4/(I1+I2), or one-half that at low levels. As the input signal Vp rises further, the gain approaches IA/I1 and the circuit functions as a soft limiter.

Assuming that control current I3 is not zero, gain at very high levels, where I1 and I3 outweigh I2 and I4, approaches I3/I1. In other words, the drop in gain at high input signal levels is arrested by the presence of I3. The detailed relationship of the various control signals and their effect on gain and compression ratios is discussed further below in conjunction with FIGS. 13 and 14.

Figure 4:
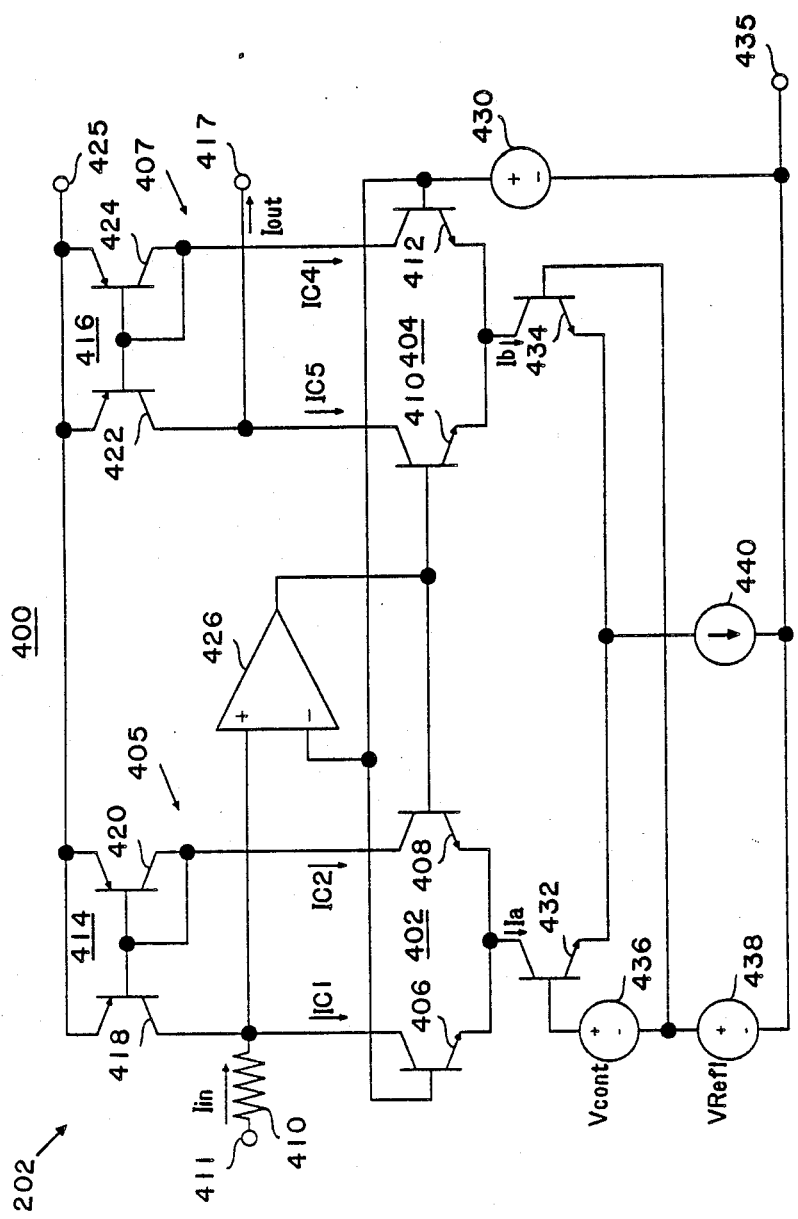
FIG. 4 is a schematic diagram of the variolosser or variable gain circuit of the present invention.

FIG. 4 is a schematic diagram of the variolosser 202 and it comprises differential cells 405 and 407 which include differential pairs 402 and 404 disposed with their emitters coupled together. Differential pair 402 is formed by transistors 406 and 408 and differential pair 404 is formed by transistors 410 and 412, respectively. Each of the differential pairs 402 and 404 are further coupled to current mirror loads 414 and 416, respectively. Current mirror 414 is formed by transistors 418 and 420 which are coupled with their bases in common and their emitters coupled to power supply input terminal 425. Current mirror 416 is formed by transistors 422 and 424 which are coupled with their bases in common and their emitters coupled to power supply input terminal 425. Transistors 420 and 424 are each disposed with their bases and collectors in common and, accordingly, they function as diodes. The current flow out of the collectors of transistors 420 and 424 establishes a base/emitter voltage in the current mirror which causes a mirrored current to be generated at the collectors of transistors 418 and 422 which is controlled by the relative sizes of the devices. In other words, transistors 420 and 418 are of identical size, the current is generated at the collector of transistor 420 will be substantially mirrored at the collector of transistor 418 in a 1-1 relationship. This basic principle is employed in all of the current mirrors described below wherein the diode connected transistor of the current mirror pair is hereinafter referred to as the current mirror reference transistor.

In the circuit 400, the differential cells 405 and 407 are coupled in a pairwise configuration. Specifically, the bases of transistors 408 and 410 are coupled in common and the bases of transistors 406 and 412 are coupled together. Stated alternatively, the inverting input of differential cell 405 is coupled to the non-inverting input of differential amplifier 407 and vice versa. Operational amplifier 426 is disposed with its inverting input coupled to the common collector connection of transistors 406 and 418 and its non-inverting input coupled to the common base connection of transistors 408 and 410. The common base connection of transistors 408 and 410 is further coupled to a source of reference potential 430. The output of operational amplifier 426 is coupled to the common base connection of transistors 408 and 410.

The input signal for the variolosser 202 is coupled to terminal 411. Resistor 410 converts the input voltage to a current. One interesting aspect of the present invention lies in the fact that the input current through resistor 410 is applied to the collectors of transistors 406 and 418 in parallel. Positive input currents therefore add directly to the collector current of transistor 406 (and vice versa). By virtue of the pairwise connections of the differential amplifier 405 and 407, equal base/emitter voltages are generated in transistors 406, 412 and 408, 410. As a result, the ratio of the collector currents in the differential pair 404 is equal to the ratio of the collector currents in differential pair 402.

Negative feedback is generated by operational amplifier 426 and is established through transistors 406 and 408, which provide a low impedance summing node for the input current as well as the proper base bias current for transistors 408 and 410. Under quiescent conditions, (Iin=0) the differential pairs 402 and 404 are balanced with IC1=IC2 and IC4=IC5. As the input current increases, an increased current, IC1, is injected into the collector of transistor 406 and therefore the base/emitter voltage of transistor 406 increases, while IC2 and the base/emitter voltage of transistor 408 decreases. Similarly, IC5 and the base/emitter voltage of transistor 410 increases while IC4 and the base/emitter voltage of transistor 412 decrease, thus producing an output current at output terminal 417.

The ratio of the output current to the input current, the current gain, is determined by the ratio of the total amount of current steered out of the common emitter connections of the differential amplifiers 402 and 404. In other words, the current gain of the variolosser is determined by the ratio of the quiescent currents Ib and Ia which generated at the respective common emitter connections of differential pairs 402 and 404. In other words, the current gain of the variolosser 400 is determined by the ratio of the quiescent collector currents Ia and Ib of transistors 432 and 434, which are coupled to the respective common emitter connections of differential pairs 402 and 404.

The quiescent collector currents of transistors 432 and 434 are controlled by their respective base voltages. If Ia is equal to Ib, the gain of circuit 400 is unity. If Ia is smaller than Ib, the gain is greater than unity and vice versa. The respective base voltages of transistors 432 and 434 may be controlled by voltage sources 436 and 438. In some applications, voltage source 438 may produce a fixed reference voltage. Voltage source 436 may be a variable voltage source which produces a control voltage (Vcont). Therefore, the relative base/emitter voltages of transistors 432 and 434 and the respective currents Ia and Ib may be controlled by varying Vcont. This control voltage may be derived from a rectifier/filter combination (not shown) coupled to the input terminal 412. It can be positive or negative simply by the choice of rectifier output polarity, thus providing either compression or expansion functions. If Vcont is positive going, the circuit 400 functions as a compressor. If Vcont is negative going, circuit 400 functions as an expander. Thus, the circuit 400 may provide either compression or expansion by merely changing the rectifier polarity. Of course, the variolosser 400 may also be operated as a fixed gain device by maintaining Vcont at a constant level.

The present invention provides a large range of current gain which may be in the range of 80 dB under the control of a small linear DC voltage which may be in the range of $-120$ mV to $+120$ mV. The sensitivity of circuit 400 is therefore in the range of 0.334 dB/mV. This is achieved by using the control voltage to control the base/emitter voltages of current sink transistors 432 and 434, thereby taking advantage of the exponential relationship between the collector current and the base-emitter voltage of a transistor in the active region as discussed above.

In the circuit 100, the variolosser relies on the virtual ground between the inputs of operational amplifier 110 (and negative feedback) to maintain equal base/emitter voltages between its two differential amplifiers and has its input applied to a diode. In contrast, the present invention maintains equal base/emitter voltages by direct connection and utilizes feedback around operational amplifier 426 to establish appropriate base current bias. Since the input signal of the circuit 400 is applied to a current mirror that is identical to the output current mirror by virtue of the pairwise connection of differential cells 405 and 407, by virtue of the pairwise connection of differential cells 405 and 407, current consumption may be held constant regardless of the signal level at input terminal 412.

In another aspect of the present invention, gain reduction occurs as the magnitude of the input signal increases. As mentioned above, the circuit 400 achieves gain reduction by steering more current into its input stage than its output stage. As a result of this action, and the action of the input current mirror, the variolosser exhibits maximum signal handling capability for the largest input signals (minimum gain), since the input signal enters the circuit at the point where the largest current is available. Furthermore, since the gain of the circuit 400 is controlled by steering the respective currents in the input and output differential amplifiers, the same circuit may be used as a compressor or expander without any additional circuitry. The circuit 400 provides a variolosser structure which may be operated successfully at voltages as low as 1.1 V. As a result of this low voltage operation, the circuit 400 is well suited for hearing aids and other low voltage applications.

Figure 5:
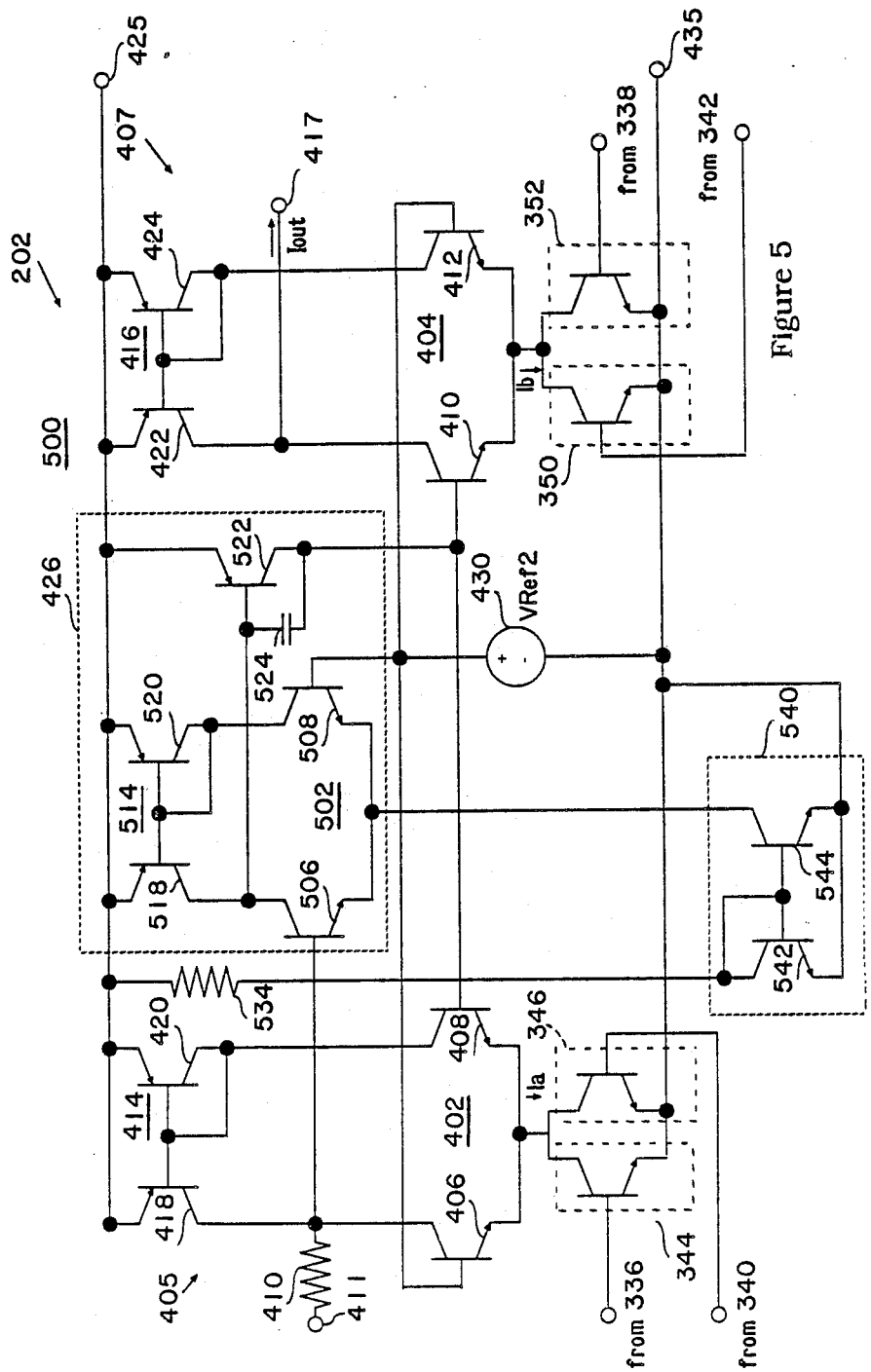
FIG. 5 is a more detailed schematic diagram of the circuit of FIG. 4.

Referring now to FIG. 5, there is shown a more detailed schematic of the circuit 400 which features improved low voltage performance. In the embodiment shown in FIG. 5, the variolosser 202 is shown as an adjustable gain circuit. For the sake of clarity, components which provide identical functions as the components of FIG. 4 bear identical designations. As above, the circuit 500 includes differential amplifiers 405 and 407 which are coupled to current mirror loads 414 and 416, respectively. The pairwise connection of the differential amplifiers 405 and 407 is identical to the connections described in conjunction with FIG. 4. The operational amplifier 426 is disposed with its inverting input coupled to the common collector connection of transistors 418 and 406 and its non-inverting input is coupled to the common base connection of transistors 406 and 412 and to the source of reference potential 430.

The operational amplifier 426 is formed by a differential pair 502 comprising transistors 506 and 508. These transistors are coupled to a current mirror load 514 comprising transistors 518 and 520 which are disposed with their bases coupled together and their emitters coupled to power supply input terminal 425. The base and collector of transistor 520 are coupled together, thereby forming the diode portion or current mirror reference transistor for the current mirror pair 514. A PNP transistor 522 forms the output stage of operational amplifier 426 wherein the base of PNP transistor 522 is coupled to the common collector connection of transistors 506 and 518. The emitter of PNP transistor 522 is coupled to the power input terminal 425 and its collector is coupled to the common base connection of transistors 408 and 410. The configuration of the operational amplifier 426 is well known and its operation will be readily understood by a person of ordinary skill in the art. Its function in circuit 500 is identical to the function of operational amplifier 426 described in conjunction with FIG. 2.

Reference currents for operational amplifier 426 are provided by the reference current generator 540 which includes NPN transistors 542 and 544 coupled in a current mirror configuration. Transistors 542 and 544 are disposed with their bases coupled together and their emitters coupled to ground terminal 435. The collector of transistor of 544 is coupled to the common emitter connection of transistors 506 and 508, thereby providing a current sink for differential pair amplifier 502. The current sinking capability of reference current generator 540 is controlled by transistor 542 disposed with its emitter coupled to ground terminal 435 and its base and collector coupled to power supply input terminal 425 through resistor 534. Since transistor 542 is clamped to ground, a fixed voltage drop will be developed across resistor 534 which causes a fixed current to flow through resistor 534 into transistor 542, which is mirrored in transistor 544, thus establishing the quiescent current of operational amplifier 426.

As above, the gain of the circuit 500 is controlled by the ratio of currents Ia and Ib. Ia flows into the collectors of transistors 344 and 345; Ib flows into the collectors of transistors 350 and 352. These transistors are in turn controlled by the circuit of FIG. 3. These currents may be controlled in a number of ways.

The low voltage operation aspect of this invention can be appreciated by reference to FIG. 5. The circuit 500 may be operated at voltages as low as 1.1 volts. As a result of this low voltage operation, it is well suited for applications such as hearing aids. The minimum operating supply voltage for the circuit 500 is determined by the total number of series voltage drops necessary to keep all transistors of the circuit 500 in their proper region of operation. The circuit 500 has three critical series voltage drops: the base/emitter voltage of transistor 420, the collector/emitter voltage of transistor 408 and the collector/emitter of voltage of transistor 432. At low bias currents, transistors in the active region require a base/emitter voltage of 0.65 volts and a collector/emitter voltage of 0.15 volts. Therefore, the circuit 500 can be reliably operated from power supply voltages as low as 1.1 volts. In practice, the circuit 500 has been operated from power supply voltages as low as 0.95 volts.

Figure 6:
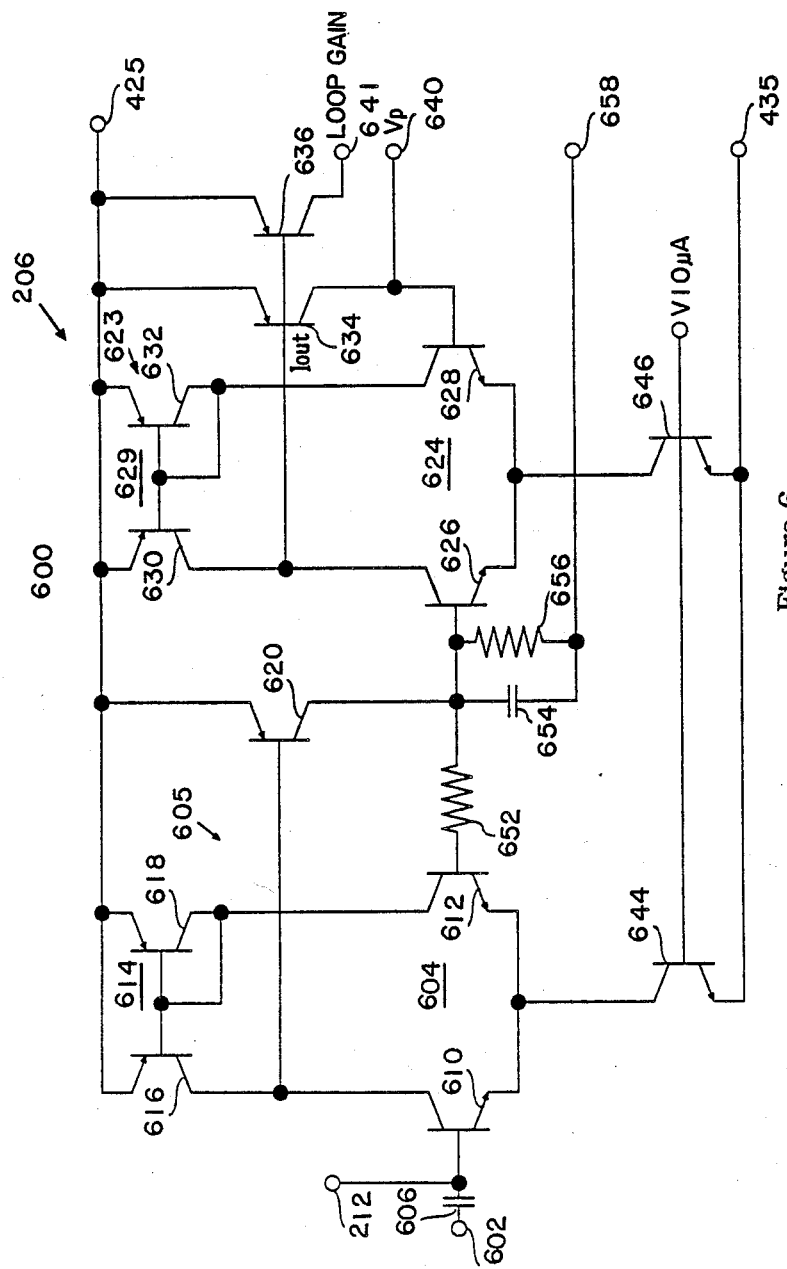
FIG. 6 is a schematic diagram of a peak detector used to detect the envelope of the audio signal processed by the compressor of the present invention.

A schematic diagram of a peak detector suitable for use with the present invention is shown in FIG. 6. The peak detector 206 generates an AC voltage related to the positive peak envelope of the audio input signal. Specifically, the peak detector generates a control signal, Vp, that follows the peak positive envelope of the audio input signal. The circuit 600 is adapted to receive an audio input signal at terminal 602. The audio input signal is AC coupled to the non-inverting input of differential amplifier 605 through capacitor 606. This audio signal is further coupled to the variolosser 202 at terminal 212. The differential amplifier 605 includes differential pair 604 comprising transistors 610 and 612 coupled in a common emitter configuration. The base of transistor 610 comprises the non-inverting input of differential amplifier 605. The differential pair 604 is coupled to a current mirror load 614 comprising transistors 616 and 618 which are disposed with their bases coupled together and their emitters coupled to power supply input terminal 425. Transistor 618 is coupled with its base and collector coupled together and comprises the reference transistor of the current mirror pair 614. The output stage of the differential amplifier 605 comprises transistor 620 which is disposed with its base coupled to the collectors of transistors 616 and 610 and its emitter coupled to power supply input terminal 425.

The output stage of peak detector 600 comprises a buffer differential amplifier 623 which includes differential pair 624 formed by transistors 626 and 628 which are disposed in a common emitter configuration. The differential pair 624 is coupled a current mirror load 629 formed by transistors 630 and 632 which are disposed with their bases coupled together and their emitters coupled to power supply input terminal 425. The base and collector of transistor 632 are coupled together, thereby forming the reference transistor of current mirror 629. The output stage of buffer differential amplifier 623 is formed by transistors 634 and 636 which are coupled with their bases coupled to the common collector connection of transistors 626 and 630 and their emitter coupled to power supply input terminal 425. The output voltage, Vp, of the peak detector 600 is generated at the collector of transistor 634 which is coupled to the peak detector output terminal 640. The collector of transistor 634 is further coupled to the base of transistor 628 to provide feedback for buffer differential amplifier 623. The collector of transistor 636 is coupled to terminal 641 and produces a loop gain control signal which will be further discussed below.

The emitter currents for differential amplifiers 605 and 623 are controlled by transistors 644 and 646, respectively, which are disposed with their collectors coupled to the respective common emitter connections of differential pairs 604 and 624, their bases coupled in common, and their emitters coupled to ground reference terminal 435. The common base connection of transistors 644 and 646 is further coupled to a current source voltage reference terminal V10μA which establishes a base/emitter voltage for transistors 644 and 646 which causes a 10 μA current to flow through the collectors of these transistors.

The output of differential amplifier 605 is coupled to the non-inverting input of differential amplifier 623. The input and output differential amplifiers 605 and 623 are coupled together through resistor 652 which is disposed between the bases of transistors 612 and 626. Feedback for differential amplifier 605 is established by resistor 652 which is further coupled to the collector of output transistor 620.

The operation of the peak detector 206 is based on capacitor 654 and resistor 656 which are coupled in parallel between the common connection of resistor 652 and the base of transistor 626 and a bias voltage reference terminal 658. In operation, capacitor 654 functions as a storage capacitor which stores a voltage equal to the peak of the input signal, for a time constant set by resistor 656 modified somewhat by the small base bias current flowing in the base of transistor 626. Capacitor 654 stores a voltage which is initially lower than the positive voltage appearing at input terminal 602. When the voltage stored on capacitor 654 is lower than the input voltage appearing at terminal 602, the relatively higher voltage appearing at terminal 602 forces transistor 610 into conduction. This in turn forces transistor 620 further into conduction, thus charging capacitor 654 rapidly. When the voltage stored on capacitor 654 exceeds the voltage appearing at terminal 602, transistor 610 is forced out of conduction and its associated current mirror transistor is forced into saturation, thus turning off the output transistor 620. In this state, the leakage resistor 656 discharges capacitor 654 and reduces the voltage stored thereon to a voltage lower than the input voltage at terminal 602. The decay rate in this discharging mode is dependent primarily on the values of resistor 656 and capacitor 654. The buffer differential amplifier 623 reduces the discharge rate of capacitor 654 by providing a high impedance source between capacitor 654 and the output terminal 640. The signal, Vp, appearing at the output terminal 640 therefore comprises a rectified representation of the input voltage appearing at input terminal 602 corresponding to the peak positive envelope of the input signal.

Figure 7:
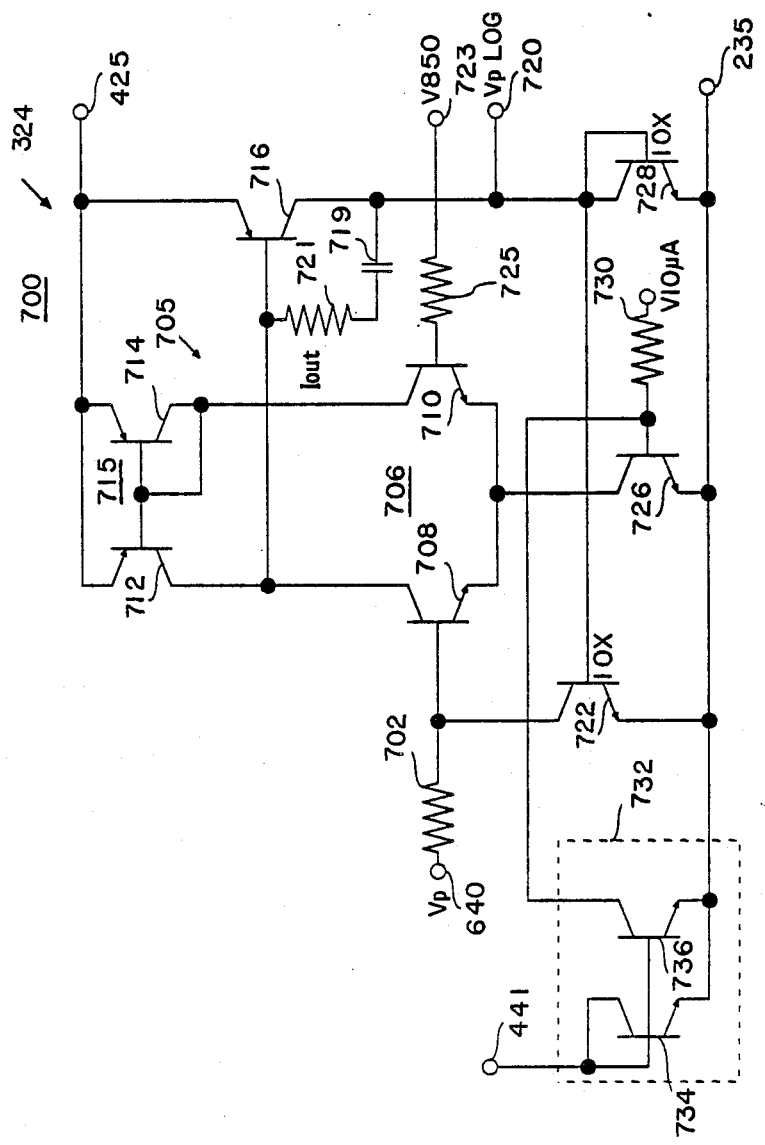
FIG. 7 is a schematic diagram of the voltage-voltage log converter described in conjunction with FIG. 3.

Referring now to FIG. 7, there is shown a schematic diagram of the voltage-to-voltage log converter 324 described in conjunction with FIG. 3. The voltage-to-voltage log converter is used to convert the linear output signal, Vp, of peak detector 600 to a corresponding logarithmically related voltage level. The input of the circuit 700 is coupled to the peak detector 600 at terminal 640. A resistor 702 is coupled between input terminal 640 and a summing node input of the input of differential amplifier 705 which is the base of transistor 708. Resistor 702 converts the voltage signal at terminal 640 to a current signal proportional to Vp processed by voltage-to-voltage log converter 700. The differential amplifier 705 includes a differential pair of transistors 706 comprising transistors 708 and 710 which have their emitters coupled in common. The base of transistor 710 is coupled to a fixed voltage reference V850 at terminal 723 through a resistor 725. The reference voltage V850 is approximately 850 millivolts. The differential pair 706 is coupled to a current mirror load 715 comprising transistors 712 and 714. The bases of transistors 712 and 714 are coupled together and their emitters are coupled to power supply input terminal 425. The base and collector of transistor 714 are coupled together, thus forming the reference transistor for the current mirror pair 715.

The output stage of differential amplifier 705 comprises transistor 716 which is disposed with its base coupled to the common collector connection of transistors 708 and 712 and its emitter coupled to the power supply input terminal 425. Frequency compensation for differential amplifier 705 is provided by a resistor 721 and capacitor 719 which are coupled in series between the base and collector of transistor 716. The collector of transistor 716 produces the output signal, Vp log, of the voltage-to-voltage log converter 700 and is coupled to output terminal 720. A transistor 729 is disposed between the input and the output of the voltage-to-voltage log converter 700 wherein the base of this transistor is coupled to the output terminal 720, its emitter is coupled to ground terminal 435, and its collector is coupled to the common connection of resistor 702 and the base of transistor 708.

The logarithmic transfer function of the voltage-to-voltage log converter 324 is generated through the interaction of resistor 702, differential amplifier 705 and transistors 722 and 728. As an increasing voltage appears at terminal 704, output transistor 716 produces an increasing output current. This in turn generates an increasing base/emitter voltage across transistor 728 which is disposed in a diode configuration. As an increasing base/emitter voltage is generated across transistor 728, transistor 722 conducts essentially all of the current flowing through resistor 702. The voltage at the base of transistor 722 is therefore logarithmically related to the current flowing through resistor 702, which in turn is linearly related to the voltage Vp at terminal 640. The quiescent current of differential amplifier 705 is controlled by current sink transistor 726. Transistor 726 is disposed with its emitter coupled to the ground reference terminal 435, its collector coupled to the the common emitter connection of differential pair 706 and its base coupled to a current source reference terminal V10$\mu$A through resistor 730.

The present invention further includes a means for improving the gain characteristics and stability of the circuit. The circuit 700 described above may be prone to instability or saturation at high input signal levels. However, it is desirable to set the gain of the voltage-to-voltage log converter 324 relatively high at lower signal levels. The voltage-to-voltage log converter 324 therefore takes advantage of the loop gain control signal generated by transistor 636 of the circuit 600. The loop gain control signal is coupled to the voltage-to-voltage log converter 324 at terminal 641. The loop gain control signal is used to control the current mirror 732 which is formed by transistors 734 and 736. Transistor 734 is coupled with its base and collector in common and therefore forms the reference transistor for the current mirror 732. The bases of transistors 734 and 736 are coupled together and the emitters of transistors 734 and 736 are coupled to the ground reference terminal 435. The collector of current mirror transistor 736 is coupled to the common connection of resistor 730 and the base of current sink transistor 726. The loop gain control signal is a positive going signal having the same envelope as the peak voltage signal Vp. At very low signal levels, the level of the loop gain control signal will be too low to activate the current mirror 732. However, as the level of the loop gain signal rises, the current mirror transistor 736 will begin to conduct, drawing reference current away from current sink transistor 726, thus reducing the gain of differential amplifier 705. Therefore, the gain of differential amplifier is reduced at high signal levels resulting in stable operation at all input signal levels.

Figure 8:
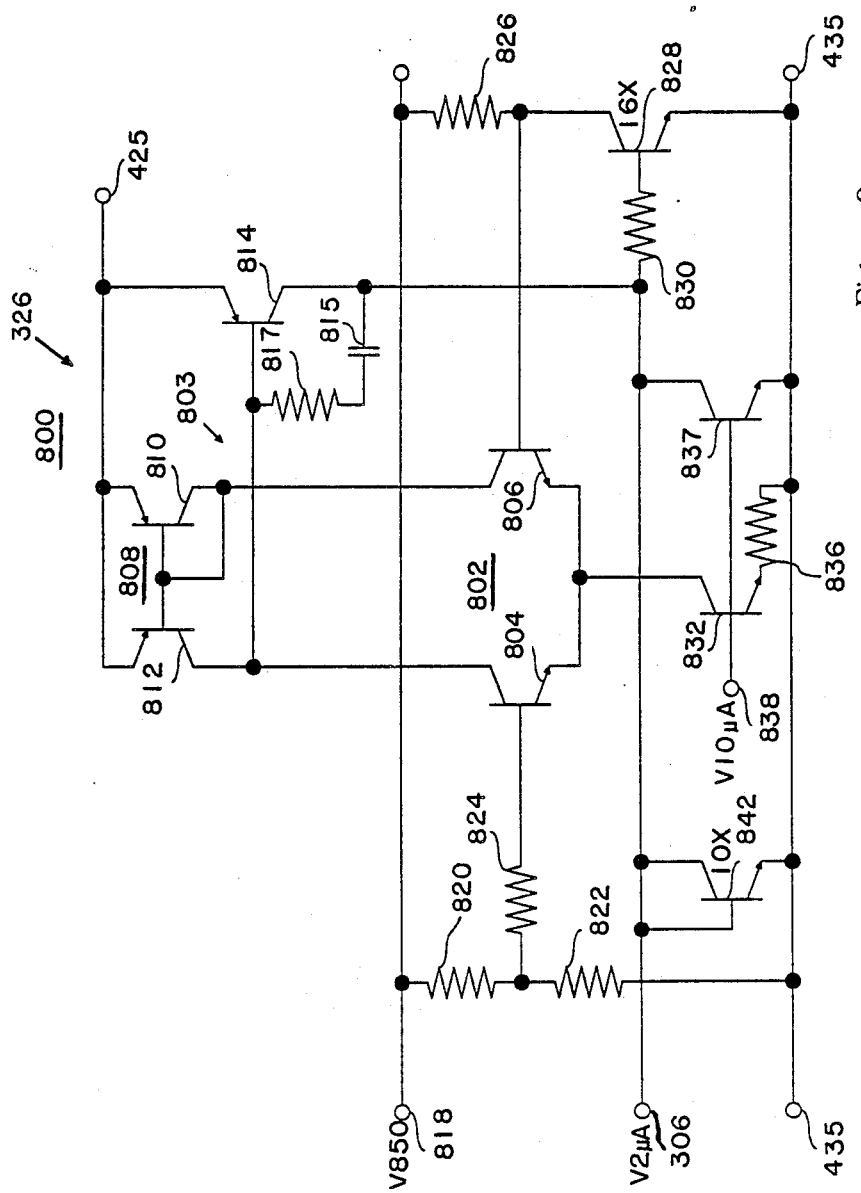
FIG. 8 is a schematic diagram of the control circuit reference current generator described in conjunction with FIG. 3.

Referring now to FIG. 8, there is shown a schematic diagram of the reference current generator of the present invention. The reference current generator 326 generates a low impedance, low noise, voltage V2$\mu$A used for establishing the (low level) gain of the compressor 300. In the preferred practice of the present invention, the reference current generator is a voltage regulator which generates a reference voltage wherein transistors with their bases coupled thereto and their emitters coupled to ground reference terminal 435 generate a 2$\mu$ reference current. The circuit 800 includes a differential amplifier 803 which incorporates differential pair 802 comprising transistors 804 and 806 disposed in a common emitter configuration. The base of transistor 804 comprises the non-inverting input of differential amplifier 803. The base of transistor 806 comprises the inverting input of differential amplifier 803. The differential pair 802 is coupled to a current mirror load 808 comprising transistors 810 and 812 which are coupled with their bases in common and their emitters coupled to power supply terminal 425. The base and collector of transistor 810 are coupled together and this device forms the reference transistor for the current mirror pair 808. The output stage of differential amplifier 803 comprises transistor 814 which is disposed with its base coupled to the common collector connection of transistors 804 and 812 and its emitter coupled to the power supply input terminal 425.

The input signals to differential amplifier 803 are derived from the regulated voltage source V850 which is coupled to the reference generator 326 at terminal 818. The V850 voltage source is described in more detail in conjunction with FIGS. 9-11. The noninverting input of differential amplifier 803 is coupled to the regulated voltage source input terminal 818 through a voltage divider formed by resistors 820 and 822. The base of transistor 804 is coupled to the common connection of resistors 820 and 822 through resistor 824. Resistor 824 increases the impedance at the base of transistor 824. Resistors 820 and 822 are selected so that approximately 50 mV is generated across resistor 820.

The inverting input of differential amplifier 803 is coupled to the regulated voltage V850 input terminal 818 through resistor 826. Transistor 828 is disposed with its collector coupled to the common connection of resistor 826 and the base of transistor 806. The emitter of transistor 828 is coupled to ground terminal 435 and the base of transistor 828 is coupled to the collector of output transistor 814 through resistor 830. The quiescent current of differential amplifier 803 is set by current sink transistor 832 which is disposed with its emitter coupled to the ground terminal 435 through resistor 836, its collector coupled to the common emitter connection of differential pair 802, and its base coupled to the current source reference voltage V10$\mu$A at terminal 838.

As mentioned above, the reference voltage appearing at terminal 818 is regulated at approximately 850 mV. Since the resistive divider formed by resistors 820 and 822 is disposed to generate an approximately 50 mV voltage drop across resistor 820, the feedback provided by transistors 814 and 828 will generate the same voltage across resistor 826, when the circuit is in regulation. Therefore, a 50 mV voltage is generated across resistor 826. Resistor 826 is chosen such that approximately 2 $\mu$A of current flow into the collector of transistor 828, thus establishing a base/emitter voltage for transistor 828 corresponding to this 2 μA current level. The base/emitter voltage of transistor 828 is used as a reference voltage, designated V2μA, which is mirrored by transistor 842, which is disposed with its base and collector coupled to the base of transistor 828 through resistor 830 and its emitter coupled to ground terminal 435. The common base/collector connection of transistor 842 is further coupled to terminal 306 which comprises the output terminal of reference current generator 326.

The quiescent current of differential amplifier 803 is controlled by the current sink transistor 832 wherein the current sinking capacity of transistor 832 is controlled by the reference voltage V10μA coupled to terminal 838. The reference voltage appearing at terminal 838 sets the current sinking capacity of transistor 832 at approximately 10 μA, reduced by resistor 836 to approximately 2 μA.

Differential amplifier 803 further includes a stabilization means. However, since the differential amplifier 803 processes a fixed voltage input signal, stabilization of differential amplifier 803 is somewhat simpler than the stabilization technique employed in conjunction with the voltage-to-voltage log converter 700. In the reference current generator circuit 800, stabilization is provided by transistor 842 which forms a current mirror reference transistor with respect to transistor 828. Transistors 842 and 828 are disposed with relative areas defined by the ratio 10/16. Thus, stability is attained by lowering the gain of differential amplifier 803 through increased feedback provided by the relative size differential of transistors 842 and 828.

Figure 9:
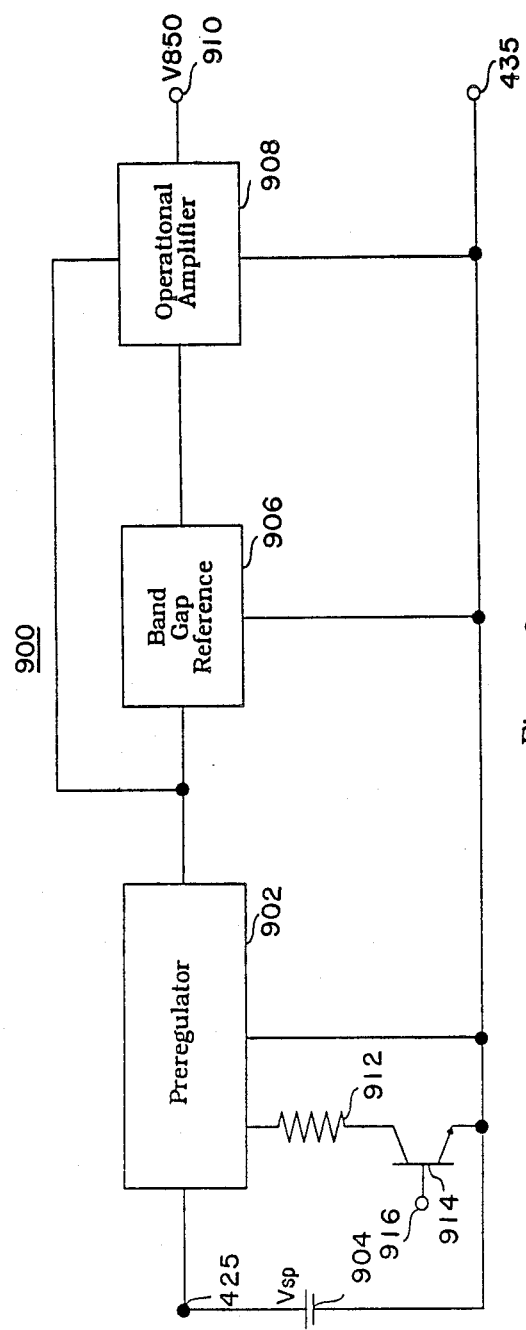
FIG. 9 is a block diagram of the voltage regulator circuit used to provide a reference voltage to the reference current generator of FIG. 8.

The reference voltage V850 used by the reference current generator and other circuits of the present invention is generated by a voltage regulator which is shown in block diagram form in FIG. 9. During the operation of the present invention, the unregulated power supply voltage may vary due to output signal generation by as much as 50 mV and by 200 mV due to battery voltage changes. This may result in undesirable distortion and instability at low battery voltages and high input signal levels. It is therefore desirable to provide power supply isolation to critical circuits to reduce or eliminate this distortion. Many of the circuits of the present invention include, between the power supply input and ground, one base/emitter voltage drop and two collector/emitter drops. As noted above, a typical base/emitter voltage drop for a small integrated circuit transistor operating in the active region is approximately 0.65 volts and a typical collector/emitter drop is approximately 0.15 volts. The voltage regulator 900 generates a reference voltage of approximately 0.85 volts which is sufficient to provide 0.65 volts for the various differential emitter coupled pairs and 0.2 V for the associated current sink transistors.

Referring now to FIG. 9, the V850 voltage regulator is shown in block diagram. The voltage regulator system 900 includes a pre-regulator which is coupled to a battery 904. The pre-regulator 902 reduces battery voltage fluctuations before application to a band gap voltage reference 906 and output differential amplifier 908. The regulated output voltage V850 is generated at output terminal 910. The voltage regulator 900 further includes a switching means comprised of resistor 912 and transistor 914. When a voltage is applied to the base of transistor 914, resistor 912 will be coupled through transistor 914 to ground terminal 435, thus disabling pre-regulator 902 and voltage regulator 900. This feature is provided to disable voltage regulator 900 during those periods when a regulated voltage is not required, thus providing a means of conserving limited battery power. The base terminal 916 of transistor 914 may be controlled manually by a switch (not shown) or automatically. All of the circuits of voltage regulator 900 are referenced to ground terminal 435.

Figure 10:
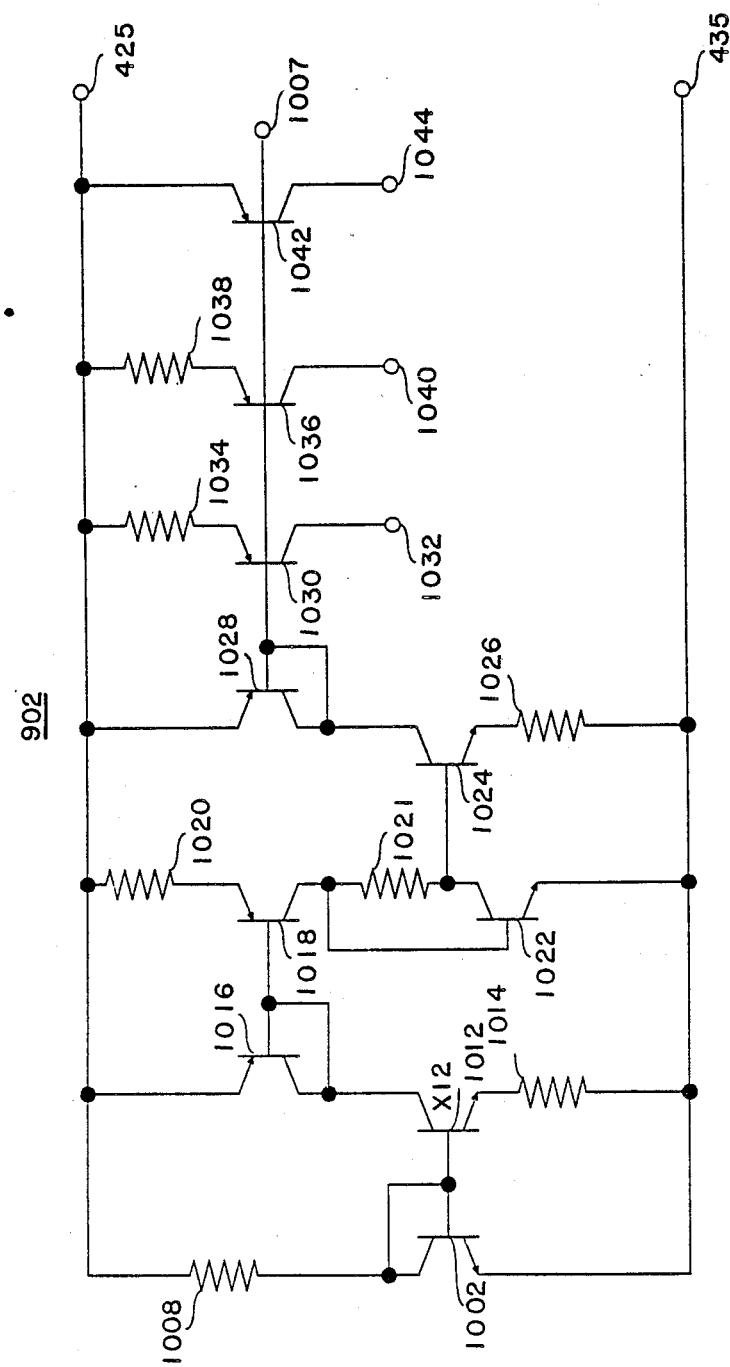
FIG. 10 is a schematic diagram of the preregulator circuit of FIG. 9.

A detailed schematic of the pre-regulator 902 is shown in FIG. 10. The pre-regulator 902 includes transistor 1002 which is disposed with its emitter coupled to ground terminal 435 and its base and collector coupled together. The common base/collector connection of transistor 1002 is coupled to power supply input terminal 425 through resistor 1008. The voltage generated across transistor 1002 is defined by the following equation:

$$Vce = Vbe = 26 \geq \ln(Vsp - Vbe/R1008 \geq Is) \, mV$$

wherein:
Vsp = battery power supply voltage
Is = Saturation current of transistor 1002, typically $10^{-10}$ μA The value of the above logarithm function is approximately 26, and since the sensitivity of ln(x) to x is approximately 1/ln(x), the voltage fluctuations on the diode connected transistor 1002 are approximately 1/28 the voltage fluctuations of the voltage which is supplied to the power supply terminal 425. The voltage appearing across transistor 1002 is coupled to the base of transistor 1012 which is disposed with its emitter coupled to ground terminal 435 through resistor 1014. Transistor 1012 is a relatively large transistor having an area ratio of 12:1 with respect to transistor 1002. Resistor 1014 is provided to linearize the relationship of collector current to base/emitter voltage in transistor 1012. Without resistor 1014, the ratio of collector current variations would be as large as the ratio of collector current variations flowing through transistor 1002 since these collector currents would be linearly related. The sensitivity of the output current to the input current of transistor 1002 is defined by the following equation:

$$Iout/Iin = 1/(1 + \ln J1/J2),$$

where J1 is the current density of transistor 1002 and J2 is the current density of transistor 1012.

With equal nominal currents in transistors 1002 and 1012, J1/J2 A2/A1, where A2/A1 represents the relative areas of transistors 1002 and 1012, the combination of transistor 1002, 1012 and resistor 1014 therefore provides a current gain sensitivity of −10.8 dB. Four of these stages are provided in the preregulator 902. The second stage is formed by transistors 1016, 1018 and resistor 1020. Transistor 1016 is disposed with its emitter coupled to the power supply input terminal 425 and its base and collector coupled together. The common base/collector connection of transistor 1016 is further coupled to the collector of transistor 1012. Transistor 1018 is disposed with its base coupled to the base of transistor 1016 and its emitter coupled to power supply input terminal 425 through resistor 1020. As above, the second stage provides a current gain of approximately −10.8 dB and the overall current gain provided at the output of this stage is approximately −22 dB. The output of the second stage, which is the collector of transistor 1018, is coupled to the third stage input transistor 1022 through resistor 1021. Transistors 1022 and 1024 and resistor 1026 form the third stage of pre-regulator 902. Transistor 1022 is disposed with its emitter coupled to ground terminal 435 and its base coupled to the collector of transistor 1018. Resistor 1021 is disposed between the base and collector of transistor 1022. Transistor 1024 is disposed with its base coupled to the collector of transistor 1022 and its emitter coupled to ground terminal 435 through resistor 1026. Resistor 1021 provides a means of providing zero sensitivity to current variations for pre-regulator 902. As the current from transistor 1018 increases, the voltage drop across resistor 1021 increases. This in turn lowers the base/emitter voltage of transistor 1024, thus tending to lower its collector current. This is balanced by the rise in base/emitter voltage of transistor 1022. Resistor 1021 is selected so its value is equal to the emitter resistance of transistor 1022. Therefore, when the third stage is in balance, the variation in collector current of transistor 1024 will be approximately zero over a wide range of collector currents of transistor 1022 as well as a wide range of temperature. When in balance, the third stage provides nearly total isolation from current variations. The fourth and final stage of the preregulator 902 is formed by transistors 1028, 1030, 1036 and 1042 and resistors 1034, 1038. Transistor 1028 is disposed with its emitter coupled to the power supply input terminal 425 and its base and collector coupled together wherein the common base/collector connection of transistor 1028 is coupled to the collector of transistor 1024. Transistors 1028, 1030, 1036 and 1042 are disposed with their bases coupled in common. The emitter of transistor 1030 is coupled to the power supply input terminal 425 through resistor 1034. The emitter of transistor 1036 is coupled to the power supply input terminal 425 through resistor 1038. The emitter of transistor 1042 is coupled directly to the power supply input terminal 425. Transistor 1028 functions as a current mirror reference transistor wherein the base/emitter voltage of transistor 1028 causes a related base/emitter voltage to be generated across transistors 1030, 1036 and 1042. Resistors 1034 and 1038 decrease the base/emitter voltage of transistors 1034 and 1036 relative to transistor 1028 and they also provide the same gain linearizing function as resistors 1014, 1020 and 1026. The value of resistors 1034 and 1038 and the area of transistors 1030, 1036 and 1042 are selected to produce a desired current output at terminals 1032, 1040 and 1044, respectively. The regulated current produced at terminal 1032 is used by the band-gap voltage source 906 and the current produced at terminal 1040 is used by the operational amplifier 908. The collector of transistor 1042 is coupled to the output stage of operational amplifier 908.

Figure 11:
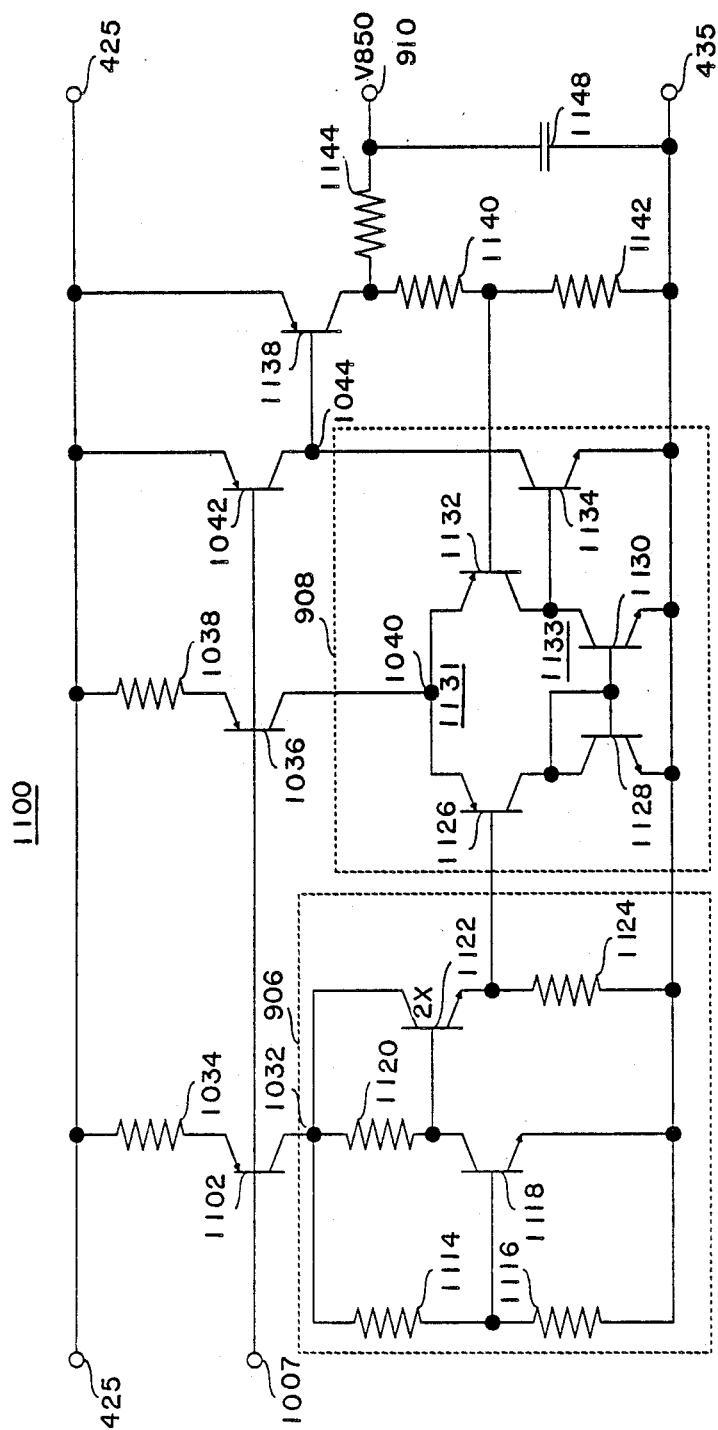
FIG. 11 is a schematic diagram of the band gap reference and operational amplifier of FIG. 9.

Referring now to FIG. 11, the remainder of regulator 900 is shown in detail. For the sake of clarity, components which provide identical functions as the circuits of FIGS. 9 and 10 bear identical designations. The circuit 1100 includes a band-gap voltage source 906 and a voltage regulator 908. The band-gap reference 906 is used to generate a 195 mV reference voltage which is processed by operational amplifier 908 to produce the 850 mV reference voltage used by various circuits of the present invention. The band-gap voltage reference 906 is a well known configuration first disclosed by R. J. Widlar, "A new breed of linear ICs runs at 1 volt levels," Electronics, Mar. 29, 1975 p. 115 and it produces a reference voltage which is insensitive to current and temperature fluctuations. The band-gap voltage reference includes resistors 1114 and 1116 which are disposed in series between the current source terminal 1032 and the ground reference terminal 435, thus forming a voltage divider used to bias transistor 1118. Transistor 1118 is disposed with its emitter coupled to ground reference terminal 435, its base coupled to the common connection of resistors 1114 and 1116 and its collector coupled to the current source terminal 1032 through resistor 1120. A transistor 1122 is disposed with its collector coupled to the current source terminal 1032, its base coupled to the common connection of resistor 1120 and the collector of transistor 1118 and its emitter coupled to ground terminal 435 through resistor 1124. Transistor 1122 has an emitter area that is twice the area of transistor 1118. The output of band-gap reference 906 is generated at the emitter of transistor 1122.

In operation, the current source transistor 1030 generates a fixed current which is distributed to the various devices of band-gap reference 906. The output voltage of the band-gap reference can be found by summing the following voltages: the base-to-emitter voltage of transistor 1118, the voltage across resistor 1114, the voltage across resistor 1120, and the emitter-to-base voltage of transistor 1122. The two transistor voltages are opposing and can be written as $$V_{BE1118} - V_{BE1122} = (kT/q) \geq \ln (I_{C1118}/I_{C1122}),$$

a voltage which is proportional to the absolute temperature T (k is Boltzman's constant and q is the electronic charge). The voltage across resistor 1114 is proportional to $V_{BE1118}$, which has a temperature dependence which is negative and proportional to absolute temperature. By adjusting the value of R1114, the positive and negative temperature coefficients can be made to cancel so that the output voltage is insensitive to temperature. Resistor 1120 makes the circuit insensitive to the value of current flowing from terminal 132. As this current increases, for example, the voltage across resistor 1114 increases, but most of the current increase is absorbed by transistor 1118, so that the drop across resistor 1120 increases, tending to cancel the rise. The output voltage of the band-gap reference is thereby made insensitive to both temperature and applied current.

The 195 mV voltage produced across resistor 1124 is coupled to one input of operational amplifier 908. Operational amplifier 908 includes differential pair 1131 which is formed by transistors 1126 and 1132 having their emitters coupled in common. The common emitter connection of differential pair 1131 is coupled to the collector of current source transistor 1036. The differential pair 1131 is further coupled to a current mirror load 1133 formed by transistors 1128 and 1130. Transistor 1128 is disposed with its collector and base coupled together and it forms the reference transistor for the current mirror pair 1133. The output stage of differential amplifier 908 is formed by current source transistor 1042 and transistor 1134 which is disposed with its emitter coupled to ground reference terminal 435, its base coupled to the common collector connection of transistors 1132 and 1130 and its collector coupled to the collector of current source transistor 1042. The collectors of transistors 1134 and 1042 are further coupled to the base of an output transistor 1138 which is disposed with its emitter coupled to the power supply input terminal 425. A resistive divider formed by resistors 1140 and 1142 is disposed between the collector of output transistor 1138 and ground reference terminal 435. The common connection of resistors 1140 and 1142 is further coupled to the base of transistor 1132 to provide feedback for operational amplifier 908.

During operation, the operational amplifier 908, through negative feedback, maintains equal voltages at its respective input terminals. Therefore, the 195 mV voltage produced by the band-gap voltage reference 906 will also be produced across resistor 1142 via the regulator action of operational amplifier 908. The output voltage of voltage regulator 1100 is controlled by value of resistor 1140 and may be adjusted by trimming the value of this resistor once it is formed on the integrated circuit. The voltage produced at the collector of output transistor 1138 is coupled to the output terminal 910 through resistor 1144. A capacitor 1148 is disposed between output terminal 910 and ground reference terminal 435. Resistor 1144 and capacitor 1146 cooperate to reduce high frequency feedback, thus stabilizing the circuit 1100. In the preferred practice of the present invention, the circuit 1100 is adjusted to produce an 850 mV output which is used as a voltage reference in several of the circuits described herein.

Figure 12:
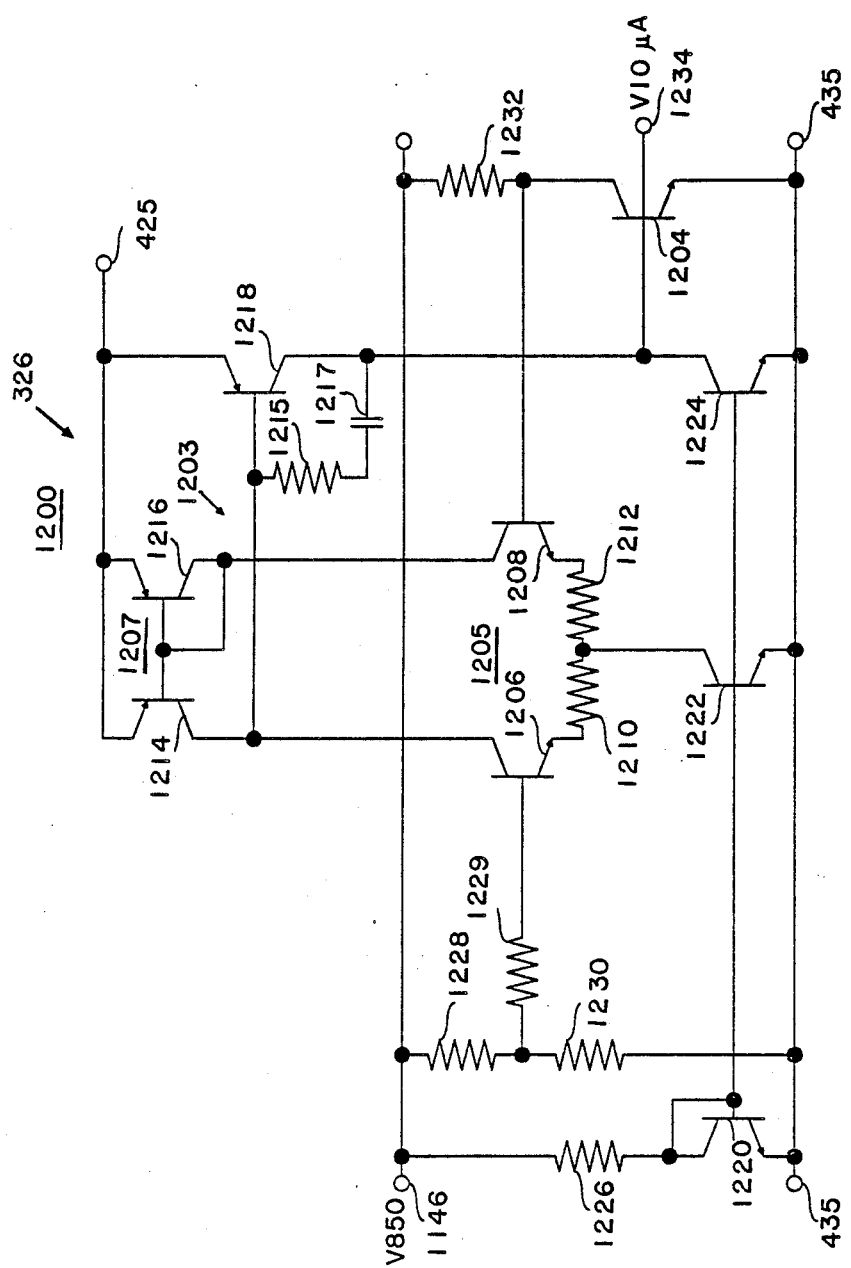
FIG. 12 is a schematic diagram of a current source reference generator used by various circuits of the present invention.

Referring now to FIG. 12, there is shown a schematic diagram of the reference generator used to generate the V10μA bias voltage mentioned above. Specifically, the V10μA current source bias reference generator 1200 employs an operational amplifier 1203 to control the base/emitter voltage of an output transistor 1204. This base/emitter voltage comprises the bias voltage V10μA used throughout the circuits of the present invention wherein transistors having a predetermined reference emitter area and their bases coupled to the V10μA bias voltage and their emitters coupled to ground terminal 435 will sink approximately 10 μA of currents. A transistor having an emitter twice the area of the reference emitter area, for example, will sink approximately 20μ. A reference voltage for the inverting input of the operational amplifier 1203 is derived from the reference voltage generator 1100 wherein the output of reference voltage generator 1100 is coupled to terminal 1146.

The operational amplifier 1203 includes a differential transistor pair 1205 comprising transistors 1206 and 1208. The emitters of differential transistors 1206 and 1208 are coupled together through resistors 1210 and 1212, respectively. The differential pair 1205 is further coupled to a current mirror load 1207 comprising transistors 1214 and 1216. The bases of transistors 1214 and 1216 are coupled together and the emitters of current mirror transistors 1214 and 1216 are coupled to the power supply input terminal 425. Current mirror transistor 1214 is coupled with its base and collector coupled in common and forms the reference transistor for current mirror pair 1207. The output of operational amplifier 1203 is formed by transistor 1218 which is disposed with its collector coupled to the collector of transistor 1224. The collector of transistor 1218 is further coupled to the base of reference transistor 1204. The emitter of transistor 1218 is coupled to power supply input terminal 425.

Bias currents for the operational amplifier 1203 are provided by transistors 1220, 1222 and 1224 which are disposed with their bases coupled together and their emitters coupled to the ground reference terminal 435. Transistor 1220 is disposed with base and collector coupled together. The common base/collector connection of transistor 1220 is coupled to the reference voltage terminal 1146 through bias resistor 1226. Transistor 1220 forms a current mirror reference transistor for transistors 1222 and 1224. The collector of transistor 1222 is coupled to the common connection of resistors 1210 and 1212 and forms the current sink bias transistor for differential pair 1205.

The input signals of operational amplifier 1203 are based on the reference voltage V850 produced by the circuit 1100. The non-inverting input of operational amplifier 1203, which is the base of transistor 1206, is coupled to the voltage source reference terminal 1146 through resistors 1228 and 1229. The common connection of resistor 1228 and resistor 1229 is further coupled to resistor 1230. The other end of resistor 1230 is coupled to the ground terminal 435. Resistors 1228 and 1230 form a resistive divider which provide a divided reference voltage at the non-inverting input of operational amplifier 1203. The inverting input of operational amplifier 1203, which is the base of transistor 1208, is coupled to the voltage reference terminal 1146 through resistor 1232. The common connection of the base of transistor 1208 and resistor 1232 is further coupled to the collector of voltage reference transistor 1204.

As mentioned above, the base/emitter voltage of voltage reference transistor 1204, which is produced at terminal 1234, is used as a voltage reference wherein transistors having their bases coupled to terminal 1234 and their emitters coupled to ground terminal 435 will sink approximately 10 μA if they are the same area. The resistive divider formed by resistors 1228 and 1230 sets an input voltage at the base of transistor 1206 at approximately 800 mV or 50 mV below the V850 voltage reference. Resistor 1226 establishes the bias current for differential amplifier 1203 by setting the current flow through transistor 1220. This current is mirrored by current sink transistors 1222 and 1224 which bias differential amplifier 1203. When the circuit 1200 is in regulation the feedback provided by transistors 1224 and 1204 will generate approximately 50 MV across resistor 1232. The value of resistor is selected so that 10 μA of current flow though resistor 1232 to the collector of transistor 1204. This current establishes a base/emitter voltage for transistor 1204 corresponding to the 10 μA current level. Thus, any NPN transistor disposed with its base coupled to terminal 1234 and its emitter coupled to ground terminal 435 and an emitter area equal to that of transistor 1204 will sink approximately 10 μA. As additional transistors are coupled to terminal 1234, differential amplifier 1234 will produce sufficient current to maintain the base/emitter voltage at terminal 1234.

Figure 13:
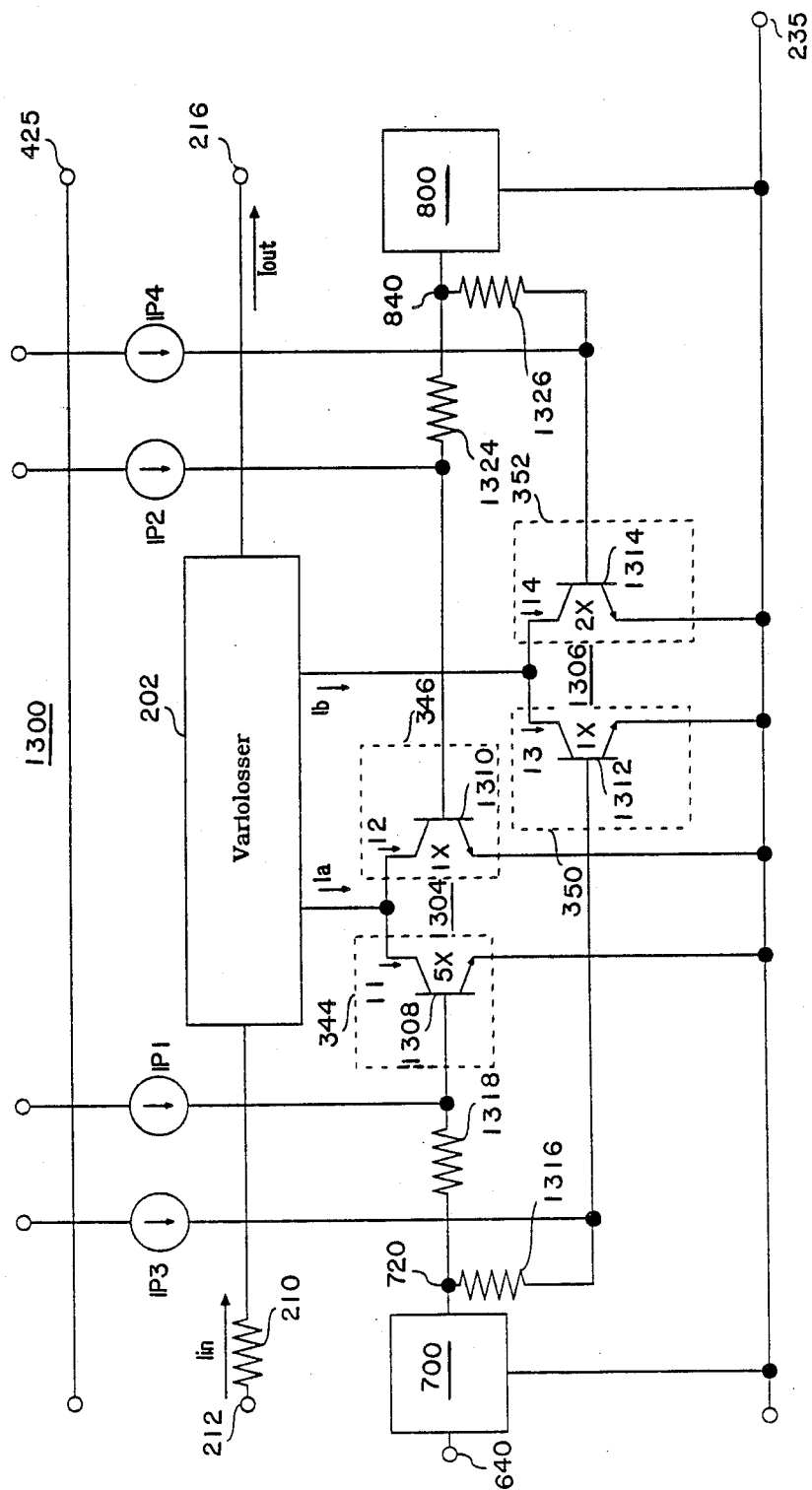
FIG. 13 is a schematic diagram of the preferred embodiment of a circuit for programmably controlling the gain of the compression system described in conjunction with FIG. 3.
Figure 15:
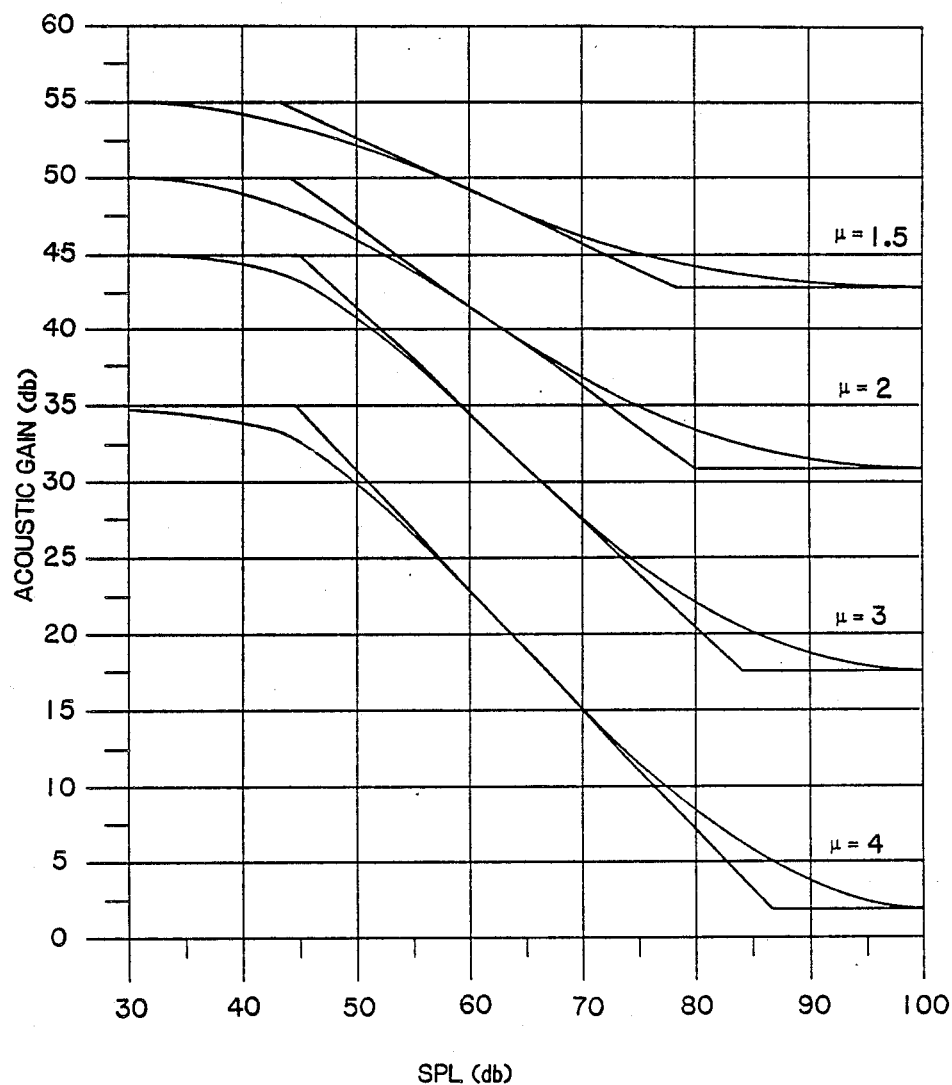
FIG. 15 is a graph showing gain as a function of input levels for various the continuously variable compression ratios provided by the programming control scheme of the present invention.

Referring now to FIG. 13, there is shown a schematic and block diagram of a circuit for controlling the variolosser 202 in accordance with the scheme described in conjunction with FIG. 3. The control circuit 1300 provides a means of combining the compressor control signal, Vp, which is the audio envelope signal generated by peak detector 206, with the four selectable compressor programming currents IP1–IP4. These programming currents IP1–IP4 may be generated by external circuitry and incremented in steps to provide a range of compression ratios and gain. This feature of the present invention may be advantageously employed to allow the user of the present compressor to vary the gain of the compressor for volume control and to vary the compression ratio for the needs of a particular user. In the preferred practice of the present invention, the four compressor programming currents IP1–IP4 are incremented in 0.667 µA steps to provide 2 dB gain increments over a range of 32 dB. The output programming currents IP3–IP4 are offset by approximately 2 µA with respect to the input control currents IP1–IP2 to allow the circuit 1300 to accommodate the above-mentioned volume control feature. The four programming currents $ID_1$–$ID_4$ may also be individually controlled to achieved a desired compression ratio, thus providing a continuously variable compression ratio. The relationship of acoustic gain versus input signal level for various compression ratios of the circuit 1300 is shown in graph form in FIG. 15.

As mentioned above in conjunction with FIGS. 2A–2D, the variolosser 202 functions as a compressor if the tail current of the input differential pair of the variolosser 202 is increased relative to the tail current in the output differential pair based on a detected peak envelope of the input audio signal. In the preferred embodiment of the present invention, the gain of the variolosser 202 is controlled by the output of reference generator 326, the programming signal Ip1–Ip4 and the output of voltage-to-voltage log converter 700. These signals are used to control current sink transistors 1308, 1310, 1312 and 1314, which correspond to exponentiating voltage-to-current converters 344, 346, 350 and 352.

The circuit 1300 includes transistor pairs 1304 and 1306. Transistor pair 1304 comprises transistors 1308 and 1310 which are disposed with their collectors coupled together and their emitters coupled to the ground reference terminal 435. Transistor pair 1306 includes transistors 1312 and 1314 which are disposed with their collectors coupled together and their emitters coupled to the ground reference terminal 435. The common collector connection of transistors 1312 and 1314 correspond to current summer 354 of FIG. 3. The collector current of the transistor pairs 1304 and 1306 control the variolosser tail currents Ia and Ib, respectively. The common collector connections of transistor pairs 1304 and 1306 correspond to respective current summers 344 and 354 of FIG. 3. As mentioned above, the peak voltage detector 600 generates a voltage, Vp, which is related to the positive peak envelope of the input audio signal. The signal, Vp, is processed by the voltage-to-voltage log converter 700 which produces the signal, Vp log. This signal is coupled to the circuit 1300 at terminal 720, and is coupled to bases of transistors 1308 and 1312 through resistors 1316 and 1318. The reference signal generated by the reference generator 326 is coupled to the circuit 1300 at terminal 840, and is coupled to the base of transistor 1310 through resistor 1324 and to the base of transistor 1314 through resistor 1326. Resistors 1318, 1324, 1316 and 1326 correspond to current-to-voltage converters 308, 330, 332 and 334, respectively.

As noted above, the gain and compression ratio of the circuit 1300 is controlled by varying the currents Ia and Ib. If Ia and Ib are increased simultaneously with the ratio remaining the same, the overall gain of the circuit 1300 remains constant. If Ia is increased more rapidly than Ib, a desired compression ratio may be obtained. In the preferred embodiment of the present invention, resistors 1316, 1318, 1324 and 1326 are approximately 9 KΩ. Increasing the current through these resistors causes a corresponding increase in the base voltages of their corresponding transistors 1308, 1310 and 1312. Therefore, increasing the current through resistors 1316, 1318, 1324 and 1326 increases the corresponding currents Ia or Ib. The voltage appearing at terminal 840 is approximately 570 mV, which corresponds to a current of 0.2 µA to flow into the base of transistor 1310 and 0.4 µA in 1314. This reference current establishes the minimum levels of the control currents Ia and Ib and the minimum gain for the circuit 1300.

The present invention relies on the inherent gain characteristic of a transistor operation in the active region to provide logarithmic gain and compressor control. This is due to the fact that a linear increment in transistor base current will cause an exponential increase in collector current of the transistor. Since tee hearing response of the human ear perceives logarithmic changes in sound level, it is desirable to alter the gain of the circuit 1300 in logarithmic steps. However, it is far simpler to generate linear increments in control currents IP1–IP4. The resistors 1316, 1318, 1324 and 1326 provide a linear current-to-voltage conversion. In the preferred practice of the present invention, transistors 1310 and 1312 are approximately the same size. Transistor 1308 is approximately five times the emitter area of transistors 1310 and 1312. Transistor 1314 is approximately two times the area of transistors 1310 and 1312.

The voltages across resistors 1316 and 1318 are added to the voltage Vp log and the added voltages are applied to the bases of transistors 1308 and 1310. The voltages across resistors 1324 and 1326 are added to V2µA and the added voltages are applied to the bases of transistors 1310 and 1314. Therefore, controlling the voltage across resistors 1316, 1318, 1324 and 1326 also controls the currents Ia or Ib.

Gain control is achieved by controlling the programming currents and the resulting voltage changes across the associated resistors. While these programming voltages are added directly to the control voltage, linear increases in programming voltages will cause an exponential gain increase in the variolosser 202. In the preferred practice of the present invention, the control currents IP1–IP4 are increased in steps of 0.67 µA which corresponds to a 2 dB increase in gain for the circuit 1300. The control currents IP1–IP4 may be stepped in accordance with a binary sequence to achieve gain control over a very wide range.

Although the foregoing description treats the operation of the device as a compressor, it will be apparent to those having ordinary skill in the art that operation as an expander can be easily achieved. For example, the programming currents can be adjusted so that the voltage across the resistor 1316 is related to the voltage across the resistor 1318 in such a way that the transistor 1312 will begin increasing conduction earlier than the transistor 1308 in response to a given input signal level. Thus, expansion as well as compression can be achieved by appropriate programming of the device.

The programming currents may be generated by a number of sources such as selectable current mirrors or resistive ladders which may be disposed external to the integrated circuit or may be included on the same substrate as the circuit 1300

Figure 14:
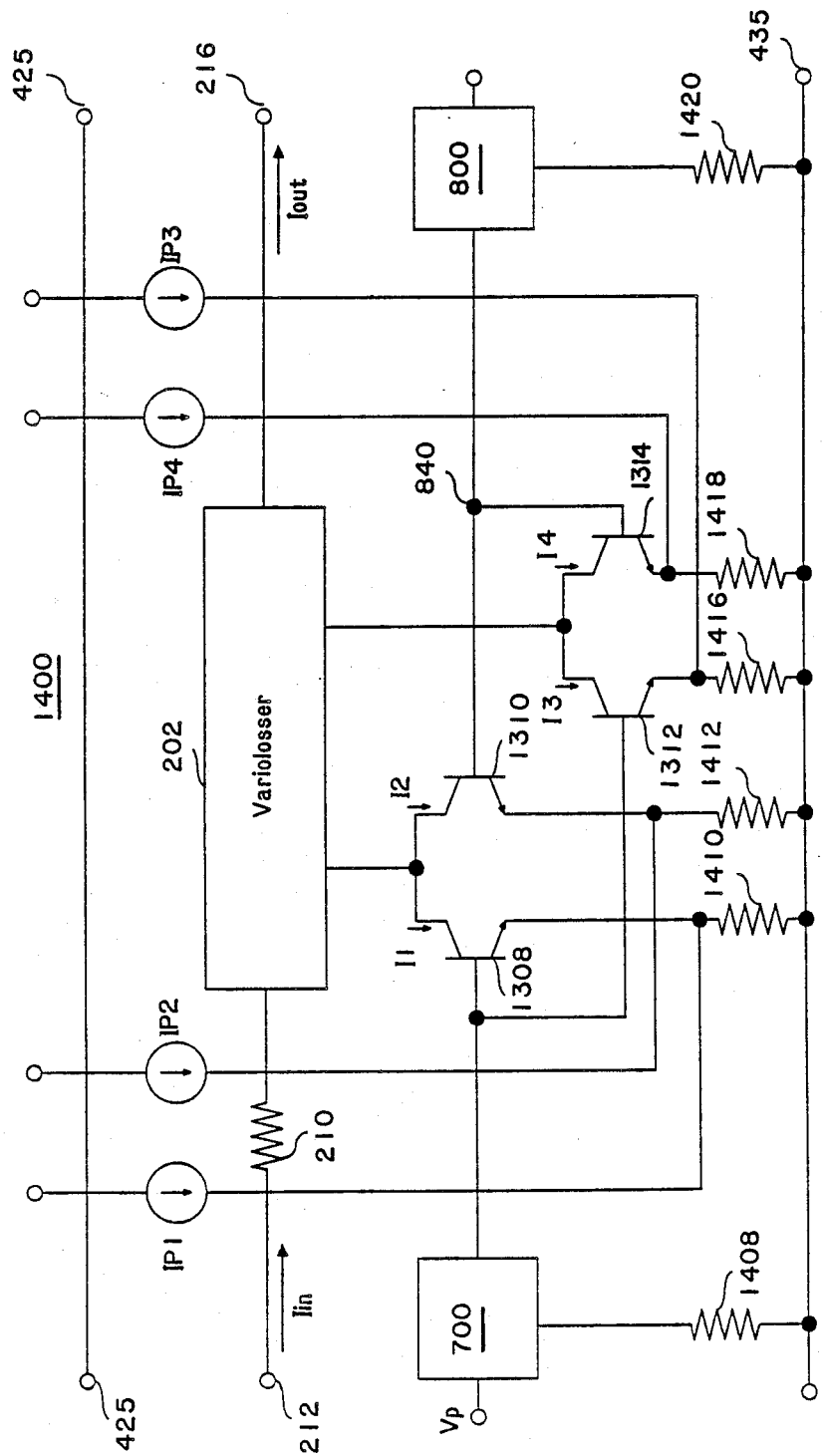
FIG. 14 is a schematic diagram of another embodiment of a circuit for programmably controlling the gain of the compression system described in conjunction with FIG. 3.

FIG. 14 is an alternate embodiment of the circuit 1300. For the sake of clarity, devices which perform the same function as the devices in FIG. 13 bear identical designations. In the circuit 1400, the transistor pairs 1304 and 1306 are used to control the currents Ia and Ib. However, in this embodiment rather than adding the control currents IP1–IP4 to the base currents of the transistor pairs 1304 and 1306, the control currents IP1–IP4 are coupled to a series of resistors 1410, 1412, 1416 and 1418 which are disposed between the emitters of transistors 1308, 1310, 1312 and 1314, respectively, and the ground reference terminal 435. In the circuit 1300, the control currents IP1-IP4 increased the gain of the circuit as the control currents increased. In contrast, in the circuit 1400 as the control currents IP1-IP4 increase, the gain of the circuit 1400 decreases. This is due to the fact that as the control currents IP1-IP4 increase, the voltage generated across resistors 1410, 1412, 1416 and 1418 also increases, thereby reducing the base/emitter voltage of transistors 1308, 1310, 1312 and 1314. This reduces the current flowing through these transistors, thus reducing the gain of the circuit 1400.

While the circuit 1400 provides satisfactory performance under most conditions, the voltage generated across resistors 1410, 1412, 1416 and 1418 limits the low voltage performance of the circuit 1400 by adding another critical series voltage drop between the variolosser 300 and the ground reference terminal 435.

In summary, an improved low voltage programmable compressor circuit has been described. The present invention includes a method and means of providing a compressor with a continuously variable compression ratio and programmable gain over a wide range. In addition, the present compressor may be operated at voltages as low or lower than 1.1 volts and is readily adapted for construction on an integrated circuit. The present invention may also be operated as an expander without any additional circuitry by merely reversing the current control terminals of the variolosser, or by programming the circuit appropriately. Accordingly, other uses and modifications will be apparent to a person of ordinary skill in the art and all of such modifications are intended to be within the scope of the present invention.

What is claimed is:

1. An improved low voltage compressor or expander adapted for implementation on an integrated circuit comprising:
    (a) input means for inputting an audio signal;
    (b) output means for outputting a processed audio signal;
    (c) variolosser means having first and second control terminals, an input terminal coupled to said inputting means and an output terminal coupled to said outputting means, said variolosser further including means for generating said processed audio signal in a predetermined gain relationship with respect to said audio signal wherein the gain relationship of said audio signal and said processed audio signal is controlled by the ratio of the currents flowing in said first and second control terminals; and
    (d) control circuit means coupled to said variolosser means for independently controlling the current flowing in each of said first and second control terminals of said variolosser means wherein the ratio of said currents is controlled based on a predetermined relationship between said audio signal and said current flowing in each of said first and second control terminals.

2. The apparatus of claim 1 wherein said control circuit includes a peak detector coupled to said input means for generating a signal related to the peak positive envelope of said audio signal and further wherein said control circuit means includes a voltage-to-current converter coupled to said peak detector means wherein the voltage-to-current converter increases the magnitude of the current flowing out of said first control terminal means as the voltage output by said peak detector means increases.

3. The apparatus of claim 1 wherein said control circuit includes a peak detector coupled to said output means for generating a signal related to the peak positive envelope of said output signal and further wherein said control circuit means includes a voltage-to-current converter coupled to said peak detector means wherein the voltage-to-current converter increases the magnitude of the current flowing out of said first control terminal means as the voltage output by said peak detector means increases.

4. The apparatus of claim 1 wherein said control circuit includes a peak detector coupled to said input means for generating a signal related to the peak positive envelope of said input signal and further wherein said control circuit means includes a voltage-to-current converter coupled to said peak detector means wherein the voltage-to-current converter increases the magnitude of the current flowing out of said second control terminal means as the voltage output by said peak detector means increases.

5. The apparatus of claim 1 wherein said control circuit means further includes programmable input means for programmably controlling the ratio of the currents flowing in said first and second control terminal means based on a plurality of input signals.

6. The apparatus of claim 5 including detectors means coupled to said input terminal for generating a first signal related to the magnitude of said input signal and wherein said programmable input means comprises:
    means coupled to said detector means for converting said first signal to a second logarithmically related to said first signal;
    reference generator means for generating a temperature compensated reference signal which is temperature compensated with respect to said second signal;
    first terminal means for receiving a first plurality of programming signals;
    second terminal means for receiving a second plurality of programming signals;
    first summing means coupled to said converter means, said first summing means for summing said second signal with said first plurality of programming signals and producing a programmed detected signal;
    second summing means coupled to said reference generator means and said second terminal means, said second summing means for multiplying said reference signal with said second plurality of programming signals for and producing a programmed reference signal;
    means for combining said programmed detected voltage and said programmed reference voltage to produce said first and second control signals.

7. The apparatus of claim wherein said detector means includes means for limiting the maximum output signal of said detector means.

8. The apparatus of claim 1 further including voltage regulation means for supplying a regulated voltage to the circuits of said improved low voltage compressor.

9. The apparatus of claim 1 wherein said compressor includes means for disabling said control circuit means upon application of a third disabling control signal.

10. The apparatus of claim 1 wherein said control circuit comprises:

detector means coupled to said input terminal for generating a first signal related to the magnitude of said audio signal;

means coupled to said detector means for converting said first signal to a second signal logarithmically related to said first signal;

reference generator for generating a temperature compensated reference signal which is temperature compensated with respect to said second signal;

first terminal means for receiving a first programming signal;

second terminal means for receiving a second programming signal;

third terminal means for receiving a third programming signal;

fourth terminal means for receiving a fourth programming signal;

means for summing said first programming signal and said second signal to produce a first produce signal;

means for summing said second programming signal and said reference signal to produce a second product signal;

means for summing said third programming signal and said second signal to produce a third product signal;

means for summing said fourth programming signal and said reference signal to produce a fourth product signal;

first combining means for combining said first and second product signals wherein the output of said combining means comprises a first control signal coupled to said first control terminal; and second combining means for combining said third of fourth product signals wherein the output of said combining means comprises a second control signal coupled to said second control terminal.

11. The apparatus of claim 6 further including a compressor or expander control circuit for generating first and second control currents in a predetermined ratio based on a plurality of input signals comprising:

detector means coupled to said input terminal for generating a first signal related to the magnitude of an input signal;

means coupled to said detector means for converting said first signal to a second signal logarithmically related to said first signal;

reference generator means for generating a temperature compensated reference signal which is temperature compensated with respect to said second signal;

first terminal means for receiving a first plurality of programming signals;

second terminal means for receiving a second plurality of programming signals;

first summing means coupled to said detector means and said first terminal means, said first summing means for multiplying said second signal with said first plurality of programing signals and producing a programmed detected signal;

second summing means coupled to said reference generator means and said second terminal means, said second summing means for summing said reference signal with said second plurality of programming signals for and producing a programmed reference signal; and means for combining said programmed detected voltage and said programmed reference voltage to produce said first and second control currents.

12. The apparatus of claim 11 wherein said programmable input means further includes means for incrementing the gain of said variolosser in logarithmic steps with linear increments in said programming currents.

13. The apparatus of claim 11 wherein said logarithmic converter means includes means for reducing the gain of said logarithmic converter means as the level of said first signal increases.

* * * * *

UNITED STATES PATENT AND TRADEMARK OFFICE
CERTIFICATE OF CORRECTION

PATENT NO. : 4,882,761

DATED : November 21, 1989

INVENTOR(S) : Fred D. Waldhauer

It is certified that error appears in the above-identified patent and that said Letters Patent is hereby corrected as shown below:

Column 1, line 54, delete "may e" and insert therefor --may be--.

Column 2, line 32, delete "1.2" and insert therefor --1.2V--.

Column 8, line 64, delete "QI" and insert therefor --Q1--.

Column 10, line 43, delete "ICI" insert therefor --IC1--.

Column 15, line 11, delete "729" and insert therefor --722--.

Column 18, line 50, delete "J1/J2 A2/A1" and insert therefor --J1/J2 = A2/A1--.

Column 20, line 61, delete "With" and insert therefor --with--.

Column 24, line 7, delete "operation" and insert therefor --operating--.

Column 24, line 11, delete "tee" and insert therefor --the--.

Column 24, line 59, after "1300" insert --.--.

Column 26, line 66, delete "third".

Column 27, line 19, delete "produce" and insert therefor --product--.

UNITED STATES PATENT AND TRADEMARK OFFICE
CERTIFICATE OF CORRECTION

PATENT NO. : 4,882,761

DATED : November 21, 1989

INVENTOR(S) : Fred D. Waldhauer

It is certified that error appears in the above-identified patent and that said Letters Patent is hereby corrected as shown below:

Column 17, line 45, "or" should be --of--

Column 21, line 28, "VIO" should be --V10--.

In Figures 4 and 5, "411", referring to the input terminal, should be --403--.

In Figures 4 and 5, "410", referring to the input resistor, should be --409--.

In Figures 4 and 5, "416", referring to the current mirror forward by transistors 422 and 424, should be --415--.

Signed and Sealed this

Fourth Day of February, 1992

Attest:

HARRY F. MANBECK, JR.

*Attesting Officer*     *Commissioner of Patents and Trademarks*